US012635126B2

(12) United States Patent
Kim et al.

(10) Patent No.: US 12,635,126 B2
(45) Date of Patent: May 19, 2026

(54) SEMICONDUCTOR MEMORY DEVICES INCLUDING STEPWISE PROFILES AND METHODS OF FABRICATING THE SAME

(71) Applicant: Samsung Electronics Co., Ltd., Suwon-si (KR)

(72) Inventors: Jina Kim, Suwon-si (KR); Kang-Uk Kim, Suwon-si (KR); Ho-In Ryu, Suwon-si (KR); Yunho Song, Suwon-si (KR); Dalhyeon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 509 days.

(21) Appl. No.: 18/194,642

(22) Filed: Apr. 2, 2023

(65) Prior Publication Data

US 2024/0040770 A1    Feb. 1, 2024

(30) Foreign Application Priority Data

Jul. 27, 2022    (KR) ........................ 10-2022-0093031

(51) Int. Cl.
H10B 12/00    (2023.01)

(52) U.S. Cl.
CPC ......... H10B 12/315 (2023.02); H10B 12/482 (2023.02); H10B 12/485 (2023.02)

(58) Field of Classification Search
CPC .... H10B 12/482; H10B 12/485; H10B 12/00; H10B 12/50; H10B 12/36; H10B 12/0335; H10B 12/315; H10B 12/30; H10B 12/05; H10B 12/34
See application file for complete search history.

(56) References Cited

U.S. PATENT DOCUMENTS

| | | | |
|---|---|---|---|
| 9,349,633 | B2 | 5/2016 | Kim et al. |
| 10,522,362 | B2 | 12/2019 | Kim et al. |
| 10,573,652 | B2 | 2/2020 | Lee et al. |
| 10,644,008 | B2 | 5/2020 | Lee et al. |
| 2021/0098460 | A1* | 4/2021 | Lee ..................... H10B 12/315 |
| 2021/0398569 | A1 | 12/2021 | Hong et al. |
| 2022/0085158 | A1 | 3/2022 | Park |
| 2022/0102528 | A1 | 3/2022 | Kim et al. |

FOREIGN PATENT DOCUMENTS

| | | |
|---|---|---|
| KR | 20190035250 A | 4/2019 |
| KR | 10-2021-0037211 A | 4/2021 |

* cited by examiner

*Primary Examiner* — John P. Dulka
(74) *Attorney, Agent, or Firm* — Wolf, Greenfield & Sacks, P.C.

(57)    ABSTRACT

A memory device includes a substrate having first and second active patterns adjacent to each other and separated by a trench, the first and second active patterns including a first source/drain region; the second active pattern includes a second source/drain region. The second source/drain region includes first and second sidewall surfaces adjacent the first source/drain region and a connecting surface that connects the first and second sidewall surfaces. The second sidewall surface is set back from the first sidewall surface. An isolation layer is included in the trench and on the first sidewall surface. A bit line includes a contact part connected to the first source/drain region. A contact is coupled to the second source/drain region with a lower spacer between the contact and the contact part of the bit line, a landing pad on the contact, and a data storage element on the landing pad.

20 Claims, 49 Drawing Sheets

SEMICONDUCTOR MEMORY DEVICES INCLUDING STEPWISE PROFILES AND METHODS OF FABRICATING THE SAME

CROSS-REFERENCE TO RELATED APPLICATION

This U.S. nonprovisional application claims priority under 35 U.S.C § 119 to Korean Patent Application No. 10-2022-0093031 filed on Jul. 27, 2022, in the Korean Intellectual Property Office, the disclosure of which is hereby incorporated by reference in its entirety by reference.

BACKGROUND

The present disclosure relates to semiconductor memory devices and methods of fabricating the same, and more particularly, to semiconductor memory devices with improved electrical properties and methods of forming the same.

Semiconductor devices have an important role in the electronic industry because of their small size, multi-functionality, and/or low fabrication cost. Semiconductor data storage devices can store logic data. The data storage devices are increasingly integrated with the development of the electronic industry. As a result, line widths of components constituting the data storage devices continue to decrease.

Additionally, increased reliability has been demanded with the high integration of the data storage devices. However, the high integration may reduce the reliability of the data storage devices. Therefore, various studies have been conducted to improve reliability of data storage devices.

SUMMARY

Some embodiments of present inventive concepts may provide semiconductor memory devices with improved reliability.

Some embodiments of present inventive concepts may provide methods of fabricating semiconductor memory devices with improved reliability.

According to some embodiments of present inventive concepts, a semiconductor memory device may include a substrate, a device isolation layer, a bit line, a lower spacer, a contact pad, a landing pad, and a data storage element. The substrate may include a first active pattern and a second active pattern that are adjacent to each other, wherein a trench separates the first and second active patterns. The first active pattern includes a first source/drain region, and the second active pattern includes a second source/drain region. Moreover, the second source/drain region includes first and second sidewall surfaces adjacent the first source/drain region and a connecting surface that connects the first and second sidewall surfaces, and the second sidewall surface is set back from the first sidewall surface relative to the first source/drain region. The device isolation layer is in the trench between the first and second active patterns, and the device isolation layer is on the first sidewall surface of the second source/drain region. The bit line extends in a first direction on the substrate, and the bit line includes a contact part electrically connected to the first source/drain region. The lower spacer is on the device isolation layer, on a sidewall of the contact part of the bit line, and on the second sidewall surface of the second source/drain region. The contact is coupled to the second source/drain region, wherein a portion of the lower spacer is between the contact and the contact part of the bit line. The landing pad is on the contact, and the data storage element is on the landing pad.

According to some embodiments of present inventive concepts, a semiconductor memory device may include a substrate, a bit line, a first lower spacer, a second lower spacer, first and second contacts, first and second landing pads, and first and second data storage elements. The substrate may include a first active pattern, a second active pattern, and a third active pattern, with the first active pattern being between the second and third active patterns. The bit line is on the substrate, with the bit line including a contact part electrically connected to the first active pattern. The first lower spacer is on a first sidewall of the contact part, wherein the first lower spacer is between the contact part and the second active pattern. The second lower spacer is on a second sidewall of the contact part, wherein the second lower spacer is between the contact part and the third active pattern. The first contact is adjacent to the first sidewall and is coupled to the second active pattern, and the second contact is adjacent to the second sidewall and is coupled to the third active pattern. The first landing pad is on the first contact, the second landing pad is on the second contact, the first data storage element is on the first landing pad, and the second data storage element is on the second landing pad. Moreover, a volume of the first lower spacer on the first sidewall may be different from a volume of the second lower spacer on the second sidewall, a lowermost point of the first contact may be at a first level, and a lowermost point of the second contact may be at a second level different from the first level.

According to some embodiments of present inventive concepts, a semiconductor memory device may include a substrate, a device isolation layer, a dielectric layer, a line structure, a lower spacer, an upper spacer, a contact, a landing pad, and a data storage element. The substrate includes a first active pattern and a second active pattern that are adjacent to each other with a trench between the first and second active patterns, the first active pattern includes a first source/drain region, and the second active pattern includes a second source/drain region. The device isolation layer is in the trench between the first and second active patterns, and the dielectric layer is on the substrate. The line structure is on the dielectric layer with the line structure including a contact part that penetrates the dielectric layer and is coupled to the first source/drain region, a bit line on the contact part, and a barrier pattern between the bit line and the contact part. The lower spacer is on a sidewall of the contact part, and the upper spacer is on the lower spacer, with the upper spacer covering a sidewall of the bit line. The contact is coupled to the second source/drain region, wherein the lower spacer is between the contact and the contact part. The landing pad is on the contact, and the data storage element is on the landing pad. Moreover, the lower spacer may include a first lower spacer and a second lower spacer on the first lower spacer with the first and second lower spacers comprising different materials. In addition, the second source/drain region may include a first upper sidewall surface with the device isolation layer thereon, a second upper sidewall surface with the first lower spacer thereon, and a connecting surface that connects the first upper sidewall surface and the second upper sidewall surface to each other, with the second upper sidewall surface being set back from the first upper sidewall surface relative to the contact part of the line structure.

According to some embodiments of present inventive concepts, a method of fabricating a semiconductor memory device may include patterning a substrate to form a first active pattern and a second active pattern that are adjacent to each other with a trench therebetween, and forming a device isolation layer in the trench between the first and second active patterns. A first source/drain region may be formed on an upper portion of the first active pattern, and a second source/drain region may be formed on an upper portion of the second active pattern. A dielectric layer may be formed on the first and second active patterns, and the dielectric layer may be patterned to form a first contact hole that exposes the first source/drain region and the second source/drain region. A conductive layer may be formed that fills the first contact hole, and the conductive layer may be patterned to form a contact part coupled to the first source/ drain region thereby exposing a surface of the device isolation layer and a portion of the second source/drain region. A lower spacer may be formed that covers a sidewall of the contact part and that fills the first contact hole between the contact part and the second active pattern. A second contact hole may be formed that penetrates an upper portion of the lower spacer and exposes a portion of the second source/drain region. The second contact hole may be filled with a conductive material to form a contact coupled to the second source/drain region, a landing pad may be formed on the contact, and a data storage element may be formed on the landing pad.

DETAILED DESCRIPTION

Figure 1:
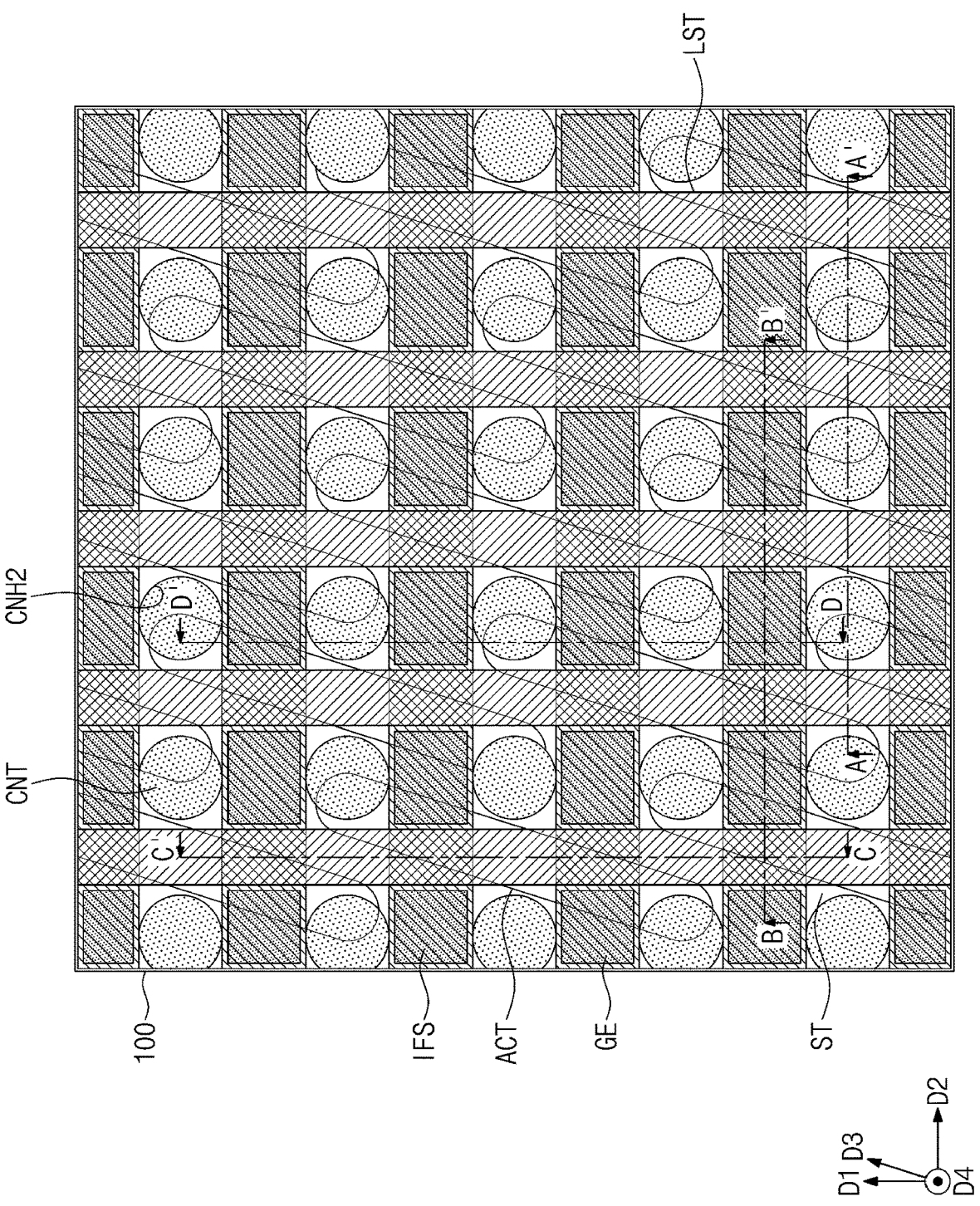
FIG. 1 is a plan view illustrating a semiconductor device according to some embodiments of present inventive concepts.

Reference will now be made in detail to embodiments, examples of which are illustrated in the accompanying drawings, wherein like reference numerals refer to like elements throughout and the sizes of each of the elements may be exaggerated for clarity and conveniences of explanation.

Spatially relative terms, such as "beneath," "below," "lower," "above," "upper," "vertical," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will also be understood that when an element is referred to as being "on" or "connected to" or "in contact with" another element, it can be directly on or directly connected to or directly in contact with the other element, or intervening elements may be present. In contrast, when an element is referred to as being "directly on" or "directly connected to" or "directly in contact with" another element, there are no intervening elements present.

FIG. 1 is a plan view illustrating a semiconductor device according to some embodiments of present inventive concepts. FIGS. 2A, 2B, 2C, and 2D are cross-sectional views respectively taken along lines A-A', B-B', C-C', and D-D' of FIG. 1. FIG. 3 is an enlarged cross-sectional view illustrating section M of FIG. 2A.

Referring to FIGS. 1 and 2A to 2D, a substrate 100 may be provided thereon with a device isolation layer ST that defines active patterns ACT. The substrate 100 may be, for example, a semiconductor substrate including silicon, germanium, and/or silicon-germanium. The device isolation layer ST may include a silicon oxide layer.

The active patterns ACT may be formed when an upper portion of the substrate 100 is patterned. Each of the active patterns ACT may extend in a third direction D3 parallel to a top surface of the substrate 100. For example, each of the active patterns ACT may have a major axis in the third direction D3. The first and second directions D1 and D2 may be orthogonal with respect to each other, and the third direction D3 may be non-orthogonal with respect to the first and second directions D2 and D3. Moreover, the first, second, and third directions D1, D2, and D3 may all be parallel with respect to the top surface of substrate 100. The active patterns ACT may be spaced apart from each other in the third direction D3.

Each of the active patterns ACT may have a width that decreases in a direction (e.g., a fourth direction D4) perpendicular to the top surface of the substrate 100. For example, the width of each active pattern ACT may decrease with increasing distance from a bottom surface of the substrate 100.

First and second trenches TR1 and TR2 may be defined between the active patterns ACT. The device isolation layer ST may fill the first and second trenches TR1 and TR2 between the active patterns ACT. Each first trench TR1 may be defined between a pair of active patterns ACT that are adjacent to each other in the second direction D2. Each second trench TR2 may be defined between a pair of active patterns ACT that are adjacent to each other in the third direction D3.

A distance between a pair of active patterns ACT adjacent to each other in the second direction D2 may be less than a distance between a pair of active patterns ACT adjacent to each other in the third direction D3. As such, the second trench TR2 may be deeper than the first trench TR1. For example, the second trench TR2 may have a bottom lower than that of the first trench TR1 (see FIG. 2B).

Each of the active patterns ACT may have on its upper portion, a first source/drain region SD1 and a pair of second source/drain regions SD2. The first source/drain region SD1 may be positioned between the pair of second source/drain regions SD2. In such a configuration, when viewed in plan, the second source/drain region SD2, the first source/drain region SD1, and the second source/drain region SD2 may be sequentially arranged along the third direction D3.

Figure 2A:
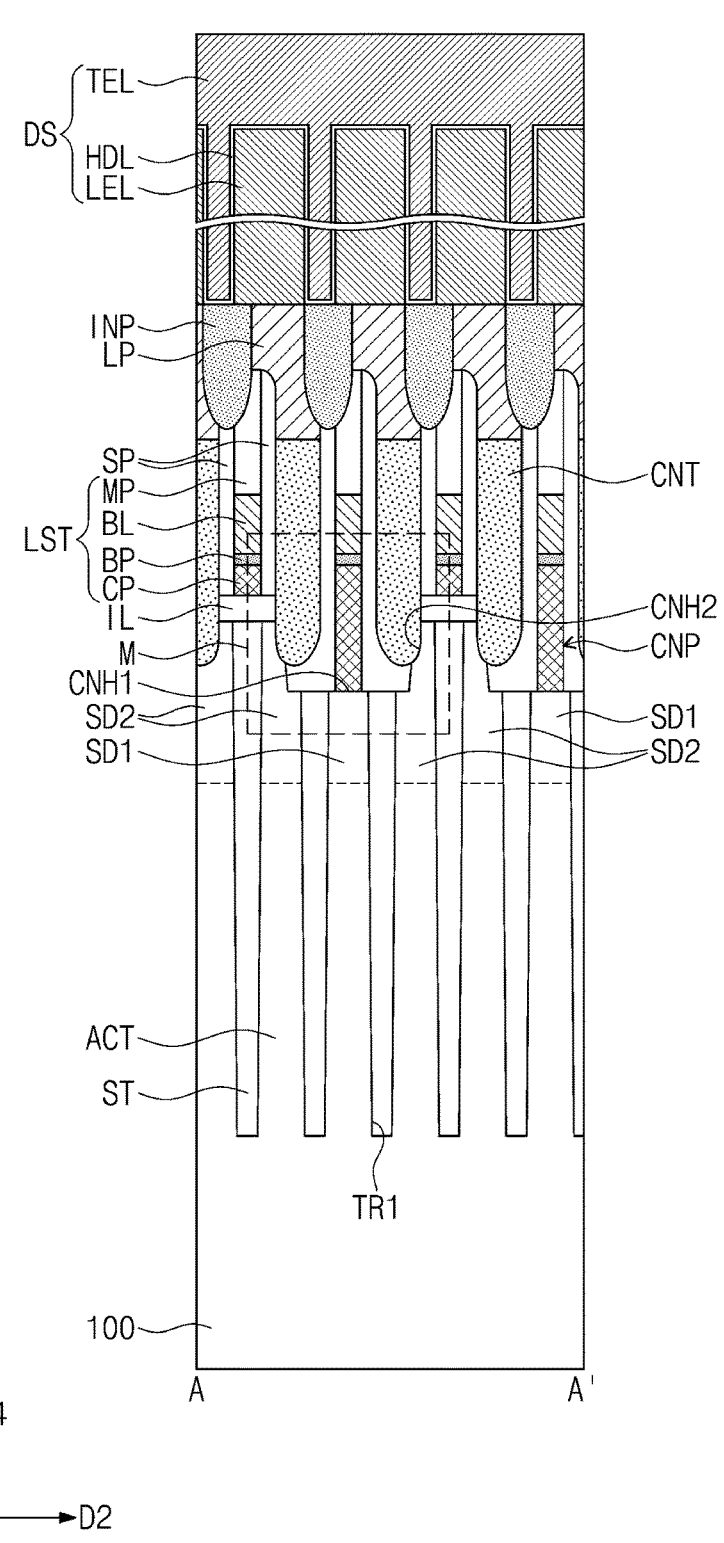
FIGS. 2A, 2B, 2C, and 2D are cross-sectional views respectively taken along lines A-A', B-B', C-C', and D-D' of FIG. 1.
Figure 2B:
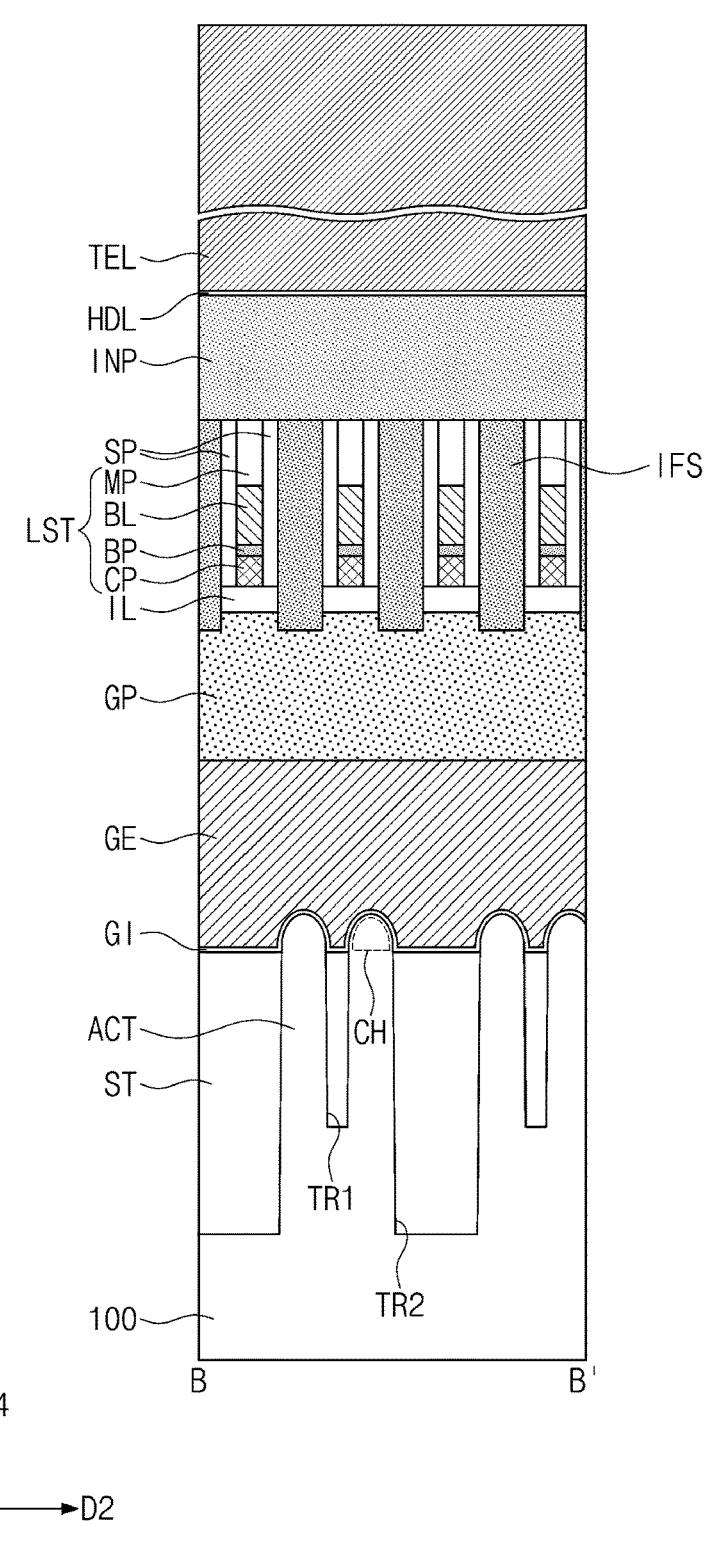
Figure 2C:
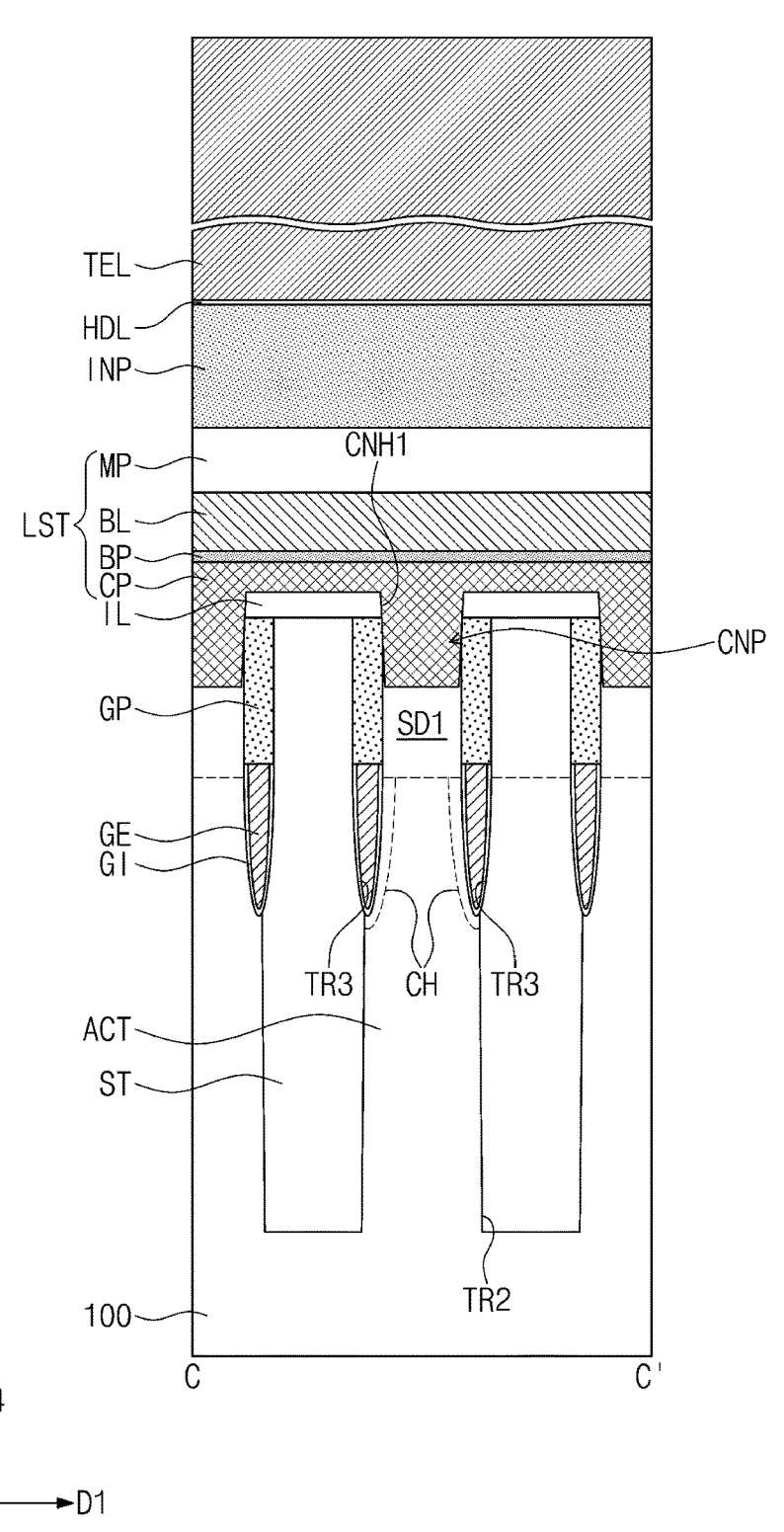
Figure 2D:
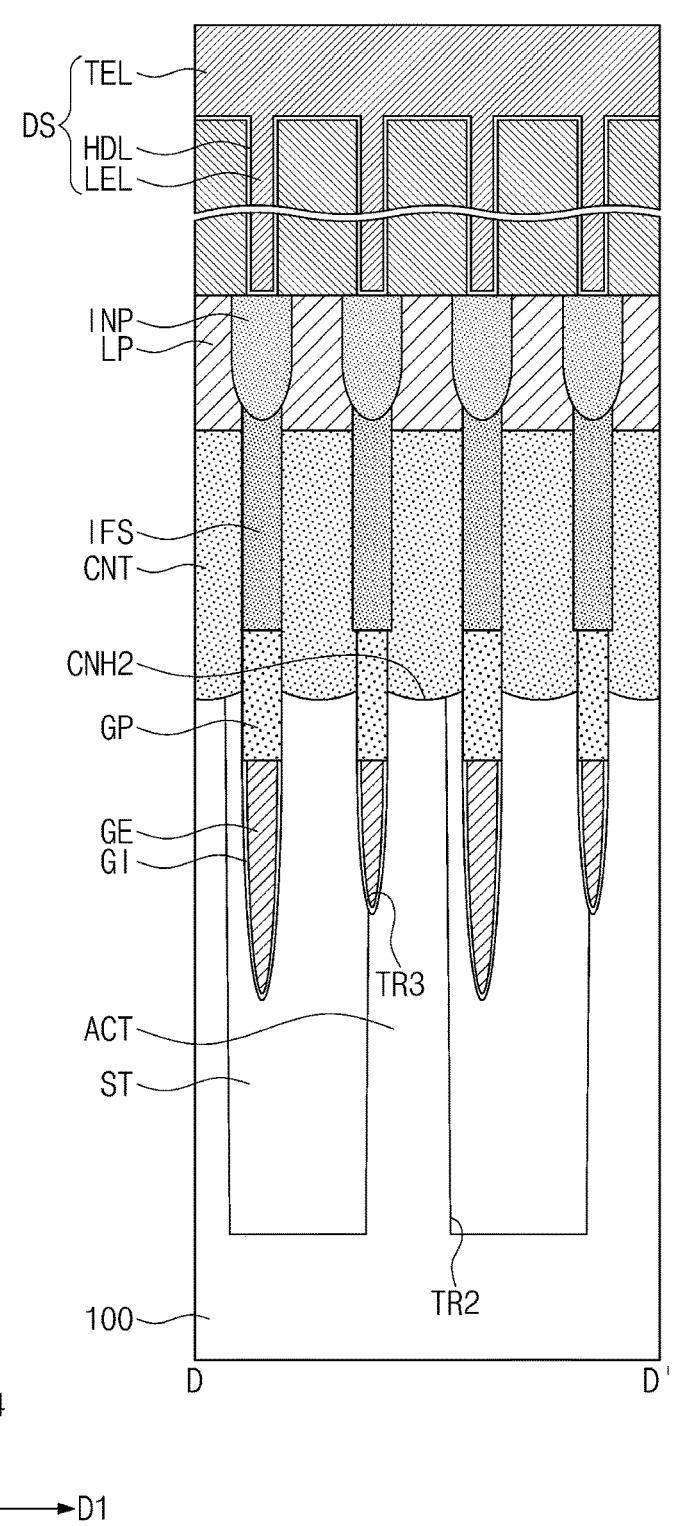
Figure 3:
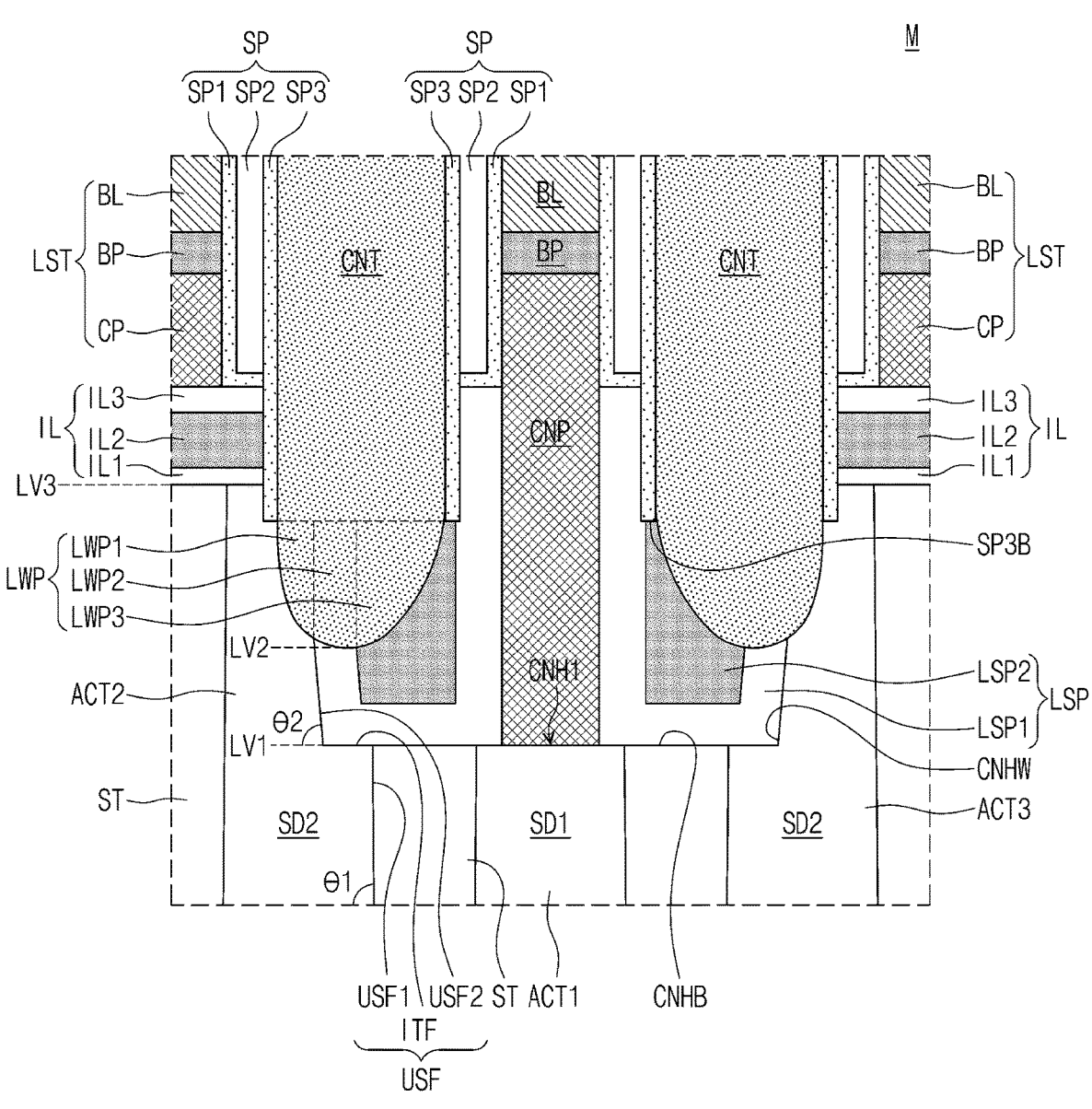
FIG. 3 is an enlarged cross-sectional view illustrating section M of FIG. 2A.

A pair of third trenches TR3 may be defined on each of the active patterns ACT (see FIG. 2C). Each of the third trenches TR3 may be defined between the first source/drain region SD1 and the second source/drain region SD2. The third trench TR3 may downwardly extend from a top surface of the active pattern ACT toward the bottom surface of the substrate 100, while penetrating the upper portion of the active pattern ACT. The third trench TR3 may have a bottom higher than those of the first and second trenches TR1 and TR2.

Each of the active patterns ACT may further include a pair of channel regions CH on the upper portion thereof. When viewed in plan, the channel region CH may be interposed between the first source/drain region SD1 and the second source/drain region SD2. The channel region CH may be disposed below the third trench TR3 (see FIG. 2C). The channel region CH may thus be positioned lower than the first and second source/drain regions SD1 and SD2.

Gate electrodes GE may be provided to run across the active patterns ACT and the device isolation layer ST. The gate electrodes GE may be correspondingly provided in the third trenches TR3. The gate electrodes GE may extend in parallel to each other in the second direction D2. A pair of gate electrodes GE may be provided on a pair of channel regions CH of the active pattern ACT. For example, when viewed in plan, the gate electrode GE may be interposed between the first source/drain region SD1 and the second source/drain region SD2. The gate electrode GE may have a top surface lower than that of the active pattern ACT (e.g., that of the first source/drain region SD1 or that of the second source/drain region SD2).

Referring back to FIG. 2C, an upper portion of the gate electrode GE may be adjacent to the first source/drain region SD1 of the active pattern ACT. A lower portion of the gate electrode GE may be adjacent to the channel region CH.

Referring back to FIGS. 1 and 2A to 2D, a gate dielectric layer GI may be interposed between the gate electrode GE and the active pattern ACT. A gate capping layer GP may be provided on the gate electrode GE. The gate capping layer GP may cover the top surface of the gate electrode GE. The gate capping layer GP may have a top surface coplanar with that of the active pattern ACT.

The gate electrode GE may include one or more of conductive metal nitride (e.g., titanium nitride or tantalum nitride) and/or metal (e.g., titanium, tantalum, tungsten, copper, or aluminum). The gate dielectric layer GI may include one or more of a silicon oxide layer, a silicon nitride layer, a silicon oxynitride layer, and/or a high-k dielectric material. For example, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof. The gate capping layer GP may include one or more of a silicon oxide layer, a silicon nitride layer, and/or a silicon oxynitride layer.

A dielectric layer IL may be provided on the substrate 100. The dielectric layer IL may include first contact holes CNH1 that expose the first source/drain regions SD1 of the active patterns ACT. For example, referring to FIG. 3, the dielectric layer IL may include a first dielectric layer IL1, a second dielectric layer IL2, and a third dielectric layer IL3 that are sequentially stacked.

Each of the first, second, and third dielectric layers IL1, IL2, and IL3 may include a silicon-based dielectric material (e.g., silicon oxide, silicon nitride, and/or silicon oxynitride). For example, the first dielectric layer IL1 may include a silicon oxide layer, the second dielectric layer IL2 may include a silicon nitride layer, and the third dielectric layer IL3 may include a silicon oxynitride layer.

The dielectric layer IL may be provided thereon with line structures LST that extend in parallel to each other in the first direction D1. The line structures LST may be arranged along the second direction D2. When viewed in plan, the line structures LST may orthogonally intersect the gate electrodes GE (see FIG. 1). A pair of spacers SP may be provided on opposite sidewalls of each of the line structures LST. The spacers SP may include one or more of a silicon oxide layer, a silicon nitride layer, and/or a silicon oxynitride layer.

For example, referring to FIG. 3, each of the spacers SP may include a first spacer SP1, a second spacer SP2, and a third spacer SP3. The first spacer SP1 may directly cover a sidewall of the line structure LST. The second spacer SP2 may be interposed between the first spacer SP1 and the third spacer SP3. The second spacer SP2 may be formed of a dielectric material whose dielectric constant is less than that of the first spacer SP1 and that of the third spacer SP3. For example, the first and third spacers SP1 and SP3 may include a silicon nitride layer, and the second spacer SP2 may include a silicon oxide layer. For another example, the second spacer SP2 may include air, or the second spacer SP2 may be an air spacer.

Each of the line structures LST may include a conductive pattern CP, a barrier pattern BP, a bit line BL, and a mask pattern MP that are sequentially stacked. The conductive pattern CP may include a contact part CNP that fills the first contact hole CNH1 and contacts the first source/drain region SD1. For example, the contact part CNP may penetrate the dielectric layer IL to extend toward the bottom surface of the substrate 100. The contact part CNP may be in direct contact with the first source/drain region SD1.

The barrier pattern BP may suppress the conductive pattern CP from receiving diffusion of a metallic material from the bit line BL. The bit line BL may be electrically connected to the first source/drain region SD1 through the barrier pattern BP and the conductive pattern CP.

The conductive pattern CP may include a doped semiconductor material (e.g., doped silicon and/or doped germanium). The barrier pattern BP may include a conductive metal nitride (e.g., titanium nitride and/or tantalum nitride).

The bit line BL may include a metallic material (e.g., titanium, tantalum, tungsten, copper, and/or aluminum).

A plurality of dielectric fences IFS may be provided on the gate capping layer GP. Each of the dielectric fences IFS may penetrate the dielectric layer IL to extend toward an upper portion of the gate capping layer GP.

Referring back to FIG. 1, the dielectric fences IFS may be two-dimensionally arranged along the first direction D1 and the second direction D2. For example, the dielectric fences IFS may be arranged along the second direction D2 on the gate capping layer GP that extends in the second direction D2. The dielectric fences IFS and the line structures LST may be alternately arranged along the second direction D2 (see FIG. 2B).

Contacts CNT may be provided to penetrate the dielectric layer IL and to contact corresponding second source/drain regions SD2. Each of the contacts CNT may fill a second contact hole CNH2 that is formed by partially etching an upper portion of the second source/drain region SD2. Referring back to FIG. 2A, the contact CNT may be in direct contact with the second source/drain region SD2 exposed by the second contact hole CNH2. In addition, the contact CNT may be in direct contact with a sidewall of the spacer SP. The spacer SP may separate the contact CNT from the line structure LST adjacent to the contact CNT. The contact CNT may be in contact with a lower spacer LSP that fills the first contact hole CNH1. The lower spacer LSP may separate the contact CNT from the contact part CNP adjacent to the contact CNT. Each of the contacts CNT may include a doped semiconductor material (e.g., doped silicon and/or doped germanium).

Referring back to FIG. 1, the contacts CNT may be two-dimensionally arranged along the first direction D1 and the second direction D2. For example, the contacts CNT and the line structures LST may be alternately arranged along the second direction D2 (see FIG. 2A). The contacts CNT and the dielectric fences IFS may be alternately arranged along the first direction D1 (see FIG. 2D).

Referring again to FIGS. 1 and 2A to 2D, the contacts CNT may be provided thereon with landing pads LP that are correspondingly coupled to the contacts CNT. The landing pads LP may be electrically connected through the contacts CNT to corresponding second source/drain regions SD2. The landing pad LP may be misaligned with the contact CNT. For example, the landing pad LP may be horizontally offset from a center of the contact CNT (see FIG. 2A). The landing pads LP may include a metallic material (e.g., titanium, tantalum, tungsten, copper, and/or aluminum).

A dielectric pattern INP may be provided on the mask patterns MP. The dielectric pattern INP may define planar shapes of the landing pads LP. The dielectric pattern INP may separate neighboring landing pads LP from each other.

A data storage element DS may be provided on the landing pads LP. For example, the data storage element DS may include first electrodes LEL provided on corresponding landing pads LP. The first electrodes LEL may be connected to the corresponding landing pads LP. The data storage element DS may further include a second electrode TEL on the first electrodes LEL and a dielectric layer HDL between the first electrodes LEL and the second electrode TEL. The first electrode LEL, the dielectric layer HDL, and the second electrode TEL may constitute a capacitor that stores data.

Each of the first electrodes LEL may have a solid pillar shape, but present inventive concepts are not limited thereto. According to some embodiments, each of the first electrodes LEL may have a cylindrical shape whose bottom is closed. A plurality of first electrodes LEL may be zigzag arranged along the first direction D1 or the second direction D2 to have a honeycomb-shaped arrangement. Alternatively, a plurality of first electrodes LEL may be disposed in a matrix shape along the first direction D1 and the second direction D2.

Each of the first electrodes LEL may be formed of, for example, impurity-doped silicon, metal such as tungsten, or a conductive metal compound such as titanium nitride. The dielectric layer HDL may include a high-k dielectric material, such as hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, and/or a combination thereof. The second electrode TEL may include doped silicon, Ru, RuO, Pt, PtO, Ir, SRO(SrRuO), BSRO((Ba,Sr)RuO), CRO (CaRuO), BaRuO, La(Sr,Co)O, Ti, TiN, W, WN, Ta, TaN, TiAlN, TiSiN, TaAlN, TaSiN, or any combination thereof.

With reference to FIG. 3, the following will describe in detail structural relationships between the first contact hole CNH1, the lower spacer LSP and the contact CNT according to some embodiments of inventive concepts.

For example, the active patterns ACT may include first, second, and third active patterns ACT1, ACT2, and ACT3 that are adjacent to each other. The first, second, and third active patterns ACT1, ACT2, and ACT3 may be arranged along the second direction D2. The first active pattern ACT1 may be positioned between the second active pattern ACT2 and the third active pattern ACT3. The device isolation layer ST may fill a space between the first, second, and third active patterns ACT1, ACT2, and ACT3.

A bottom CNHB of the first contact hole CNH1 may expose the first source/drain region SD1 of the first active pattern ACT1. The bottom CNHB of the first contact hole CNH1 may be positioned at a first level LV1. The first level LV1 may be lower than a third level LV3 of the top surface of the substrate 100. For example, the third level LV3 may be a level of an uppermost surface of each of the second and third active patterns ACT2 and ACT3.

The bottom CNHB of the first contact hole CNH1 may include inner sidewalls CNHW that extend toward uppermost surfaces of each of the second and third active patterns ACT2 and ACT3. The inner sidewall CNHW of the first contact hole CNH1 may expose a second upper lateral surface USF2 of each of the second and third active patterns ACT2 and ACT3. For example, the inner sidewall CNHW of the first contact hole CNH1 may define the second upper lateral surface USF2 of each of the second and third active patterns ACT2 and ACT3.

The contact part CNP may be coupled through the first contact hole CNH1 to the first source/drain region SD1 of the first active pattern ACT1. The second active pattern ACT2 adjacent to the contact part CNP may include an upper lateral surface USF having a stepwise profile.

The upper lateral surface USF may include a first upper lateral surface USF1 in contact with the device isolation layer ST, the second upper lateral surface USF2 defined by the inner sidewall CNHW of the first contact hole CNH1, and a flat surface ITF.

The flat surface ITF may connect the first upper lateral surface USF1 and the second upper lateral surface USF2 to each other. The flat surface ITF may be defined by the bottom CNHB of the first contact hole CNH1. The flat surface ITF may be parallel to the top surface of the substrate 100 or may have an inclination less than about 20°. The flat surface ITF may be located at the first level LV1.

The first upper lateral surface USF1 may have an inclination of a first angle θ1. The second upper lateral surface USF2 may have an inclination of a second angle θ2. The first angle θ1 may be greater than the second angle θ2.

The third active pattern ACT3 may also include an upper lateral surface USF having a stepwise profile. A description of the upper lateral surface USF of the third active pattern ACT3 may be substantially the same as the upper lateral surface USF of the second active pattern ACT2 discussed above.

The lower spacer LSP may be provided on the sidewall of the contact part CNP. The lower spacer LSP may fill the first contact hole CNH1. The lower spacer LSP may include a first lower spacer LSP1 and a second lower spacer LSP2 on the first lower spacer LSP1. The first lower spacer LSP1 may be conformally formed on the inner lateral surface CNHW and the bottom CNHB of the first contact hole CNH1.

The first lower spacer LSP1 and the second lower spacer LSP2 may include different silicon-based dielectric materials. For example, the first lower spacer LSP1 may include a silicon oxide layer, and the second lower spacer LSP2 may include a silicon nitride layer.

The first lower spacer LSP1 may directly cover the flat surface ITF and the second upper lateral surface USF2 of each of the second and third active patterns ACT2 and ACT3. The first upper lateral surface USF1 may be directly covered with the device isolation layer ST. In some embodiments of present inventive concepts, the first lower spacer LSP1 and the device isolation layer ST may include the same material, for example, silicon oxide. Therefore, no boundary may appear between the first lower spacer LSP1 and the device isolation layer ST, and the first lower spacer LSP1 and the device isolation layer ST may constitute a single silicon oxide layer. For example, the stepwise upper lateral surface USF below the contact CNT may be directly covered with a silicon oxide layer.

A pair of contacts CNT may be coupled to the second and third active patterns ACT2 and ACT3. A lower part LWP of the contact CNT may be connected to one of the second and third active patterns ACT2 and ACT3. The lower part LWP of the contact CNT may be a portion lower than the third level LV3 of the top surface of the substrate 100. The lower part LWP of the contact CNT may be a portion lower than a bottom SP3B of the third spacer SP3. For example, the lower part LWP of the contact CNT may include a first part LWP1, a second part LWP2, and a third part LWP3. The second part LWP2 may be interposed between the first part LWP1 and the third part LWP3.

The first part LWP1 may be in direct contact with one of the second and third active patterns ACT2 and ACT3. The second part LWP2 may be in direct contact with the first lower spacer LSP1 that covers the second upper lateral surface USF2. The third part LWP3 may be in direct contact with the second lower spacer LSP2. For example, a bottom surface of the contact CNT according to some embodiments of present inventive concepts may be in contact not only with the second source/drain region SD2, but also with the lower spacer LSP adjacent to the second source/drain region SD2.

A lowermost point of the contact CNT may be located at a second level LV2. The second level LV2 may be positioned between the first level LV1 and the third level LV3. In some embodiments of present inventive concepts, the lowermost point of the contact CNT may be placed at the second part LWP2. For example, the lowermost point of the contact CNT may be in contact with the first lower spacer LSP1.

The second lower spacer LSP2 according to some embodiments of present inventive concepts may be interposed between the contact part CNP and the third part LWP3 of the contact CNT. When the second lower spacer LSP2 is omitted, the third part LWP3 of the contact CNT may penetrate the first lower spacer LSP1 to expand toward the contact part CNP. This may induce short-circuit failure between the contact CNT and the contact part CNP.

According to some embodiments of present inventive concepts, the second lower spacer LSP2 may be interposed between the contact part CNP and the third part LWP3 of the contact CNT. The second lower spacer LSP2 may reduce and/or prevent expansion of the third part LWP3 of the contact CNT toward the contact part CNP. As a result, according to some embodiments of present inventive concepts, short-circuit failure between the contact CNT and the contact part CNP may be reduced and/or prevented to increase reliability of a semiconductor device.

The lower spacer LSP may be provided thereon with the spacer SP that covers the sidewall of the line structure LST. As discussed above, the spacer SP may include the first, second, and third spacers SP1, SP2, and SP3.

The first and second spacers SP1 and SP2 may be positioned on the dielectric layer IL. The third spacer SP3 may penetrate from the second spacer SP2 through the dielectric layer IL to further extend downwardly. The bottom SP3B of the third spacer SP3 may be lower than the third level LV3. The third spacer SP3 may guide the contact CNT to stably extend toward the second source/drain region SD2.

The bottom SP3B of the third spacer SP3 may be in contact with a top surface of the second lower spacer LSP2. For example, the third spacer SP3 and the second lower spacer LSP2 may be connected to each other. The third spacer SP3 and the second lower spacer LSP2 may be connected to each other to constitute a partition wall formed of a silicon nitride layer disposed between the contact CNT and the line structure LST including the contact part CNP.

Figure 4:
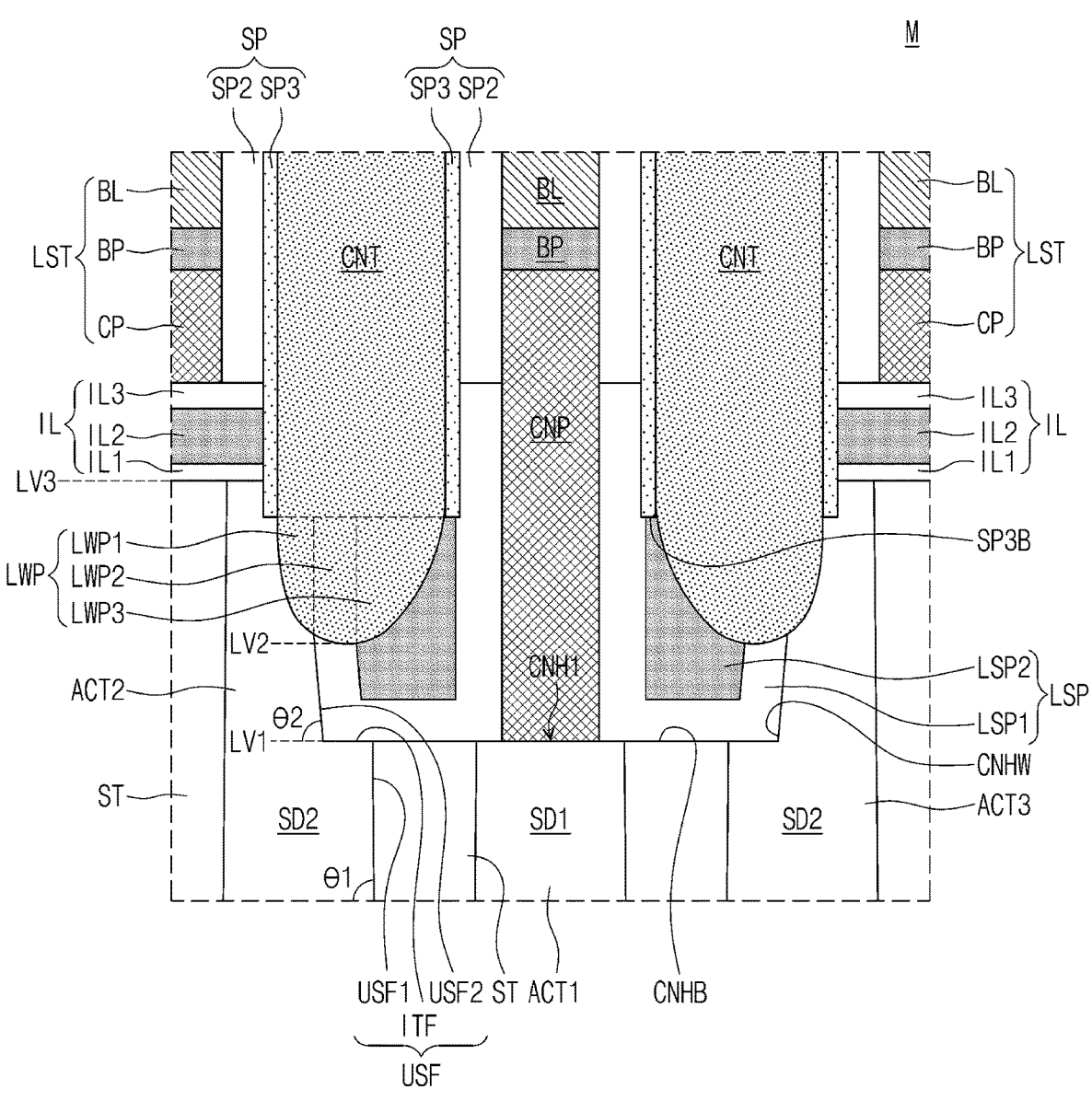
FIG. 4 is a cross-sectional view illustrating an example of a spacer depicted in FIG. 3.
Figure 5:
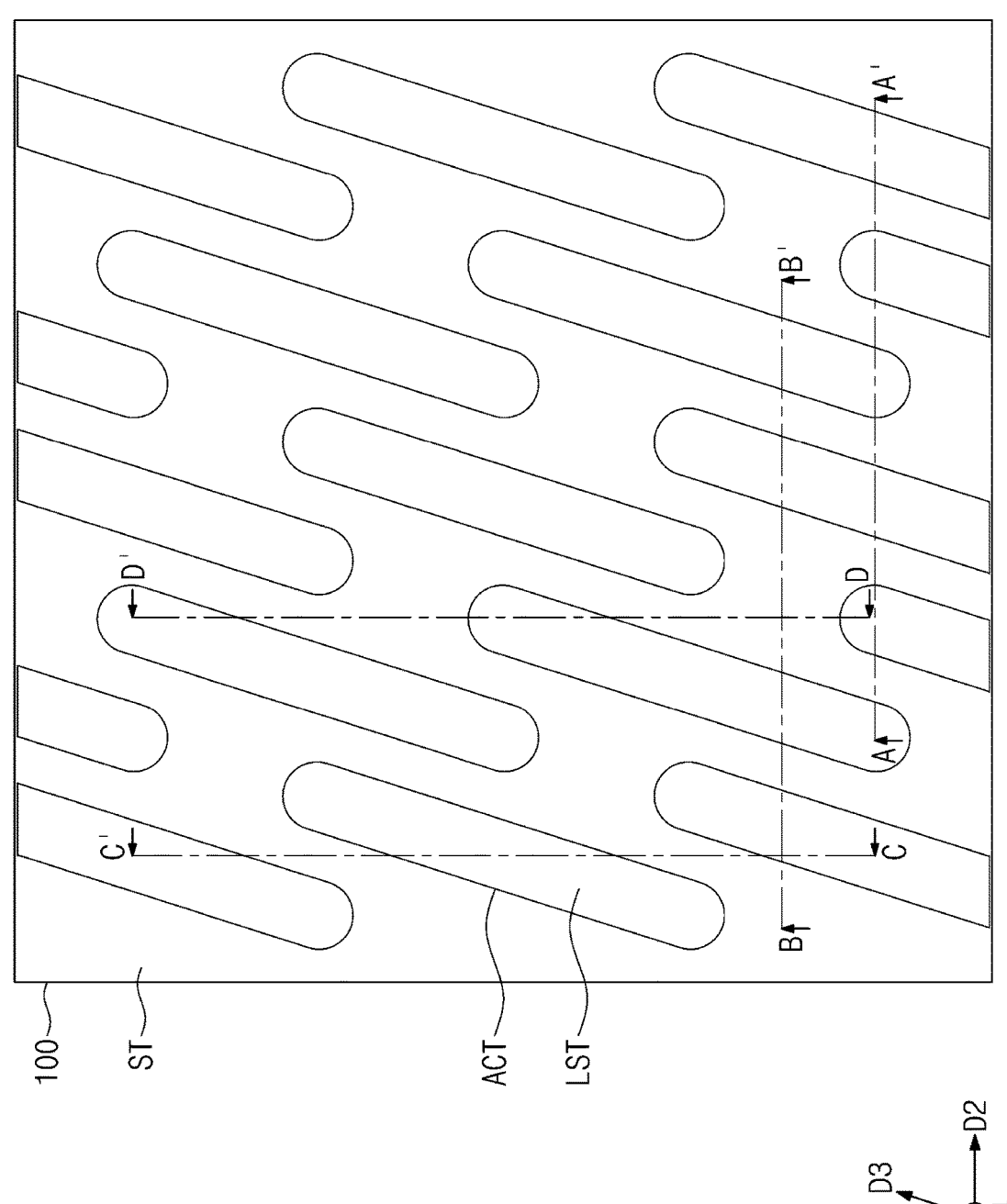
FIGS. 5, 7, 9, 11, 13, 15, and 17 are plan views illustrating operations of a method of fabricating a semiconductor device according to some embodiments of present inventive concepts.
Figure 6A:
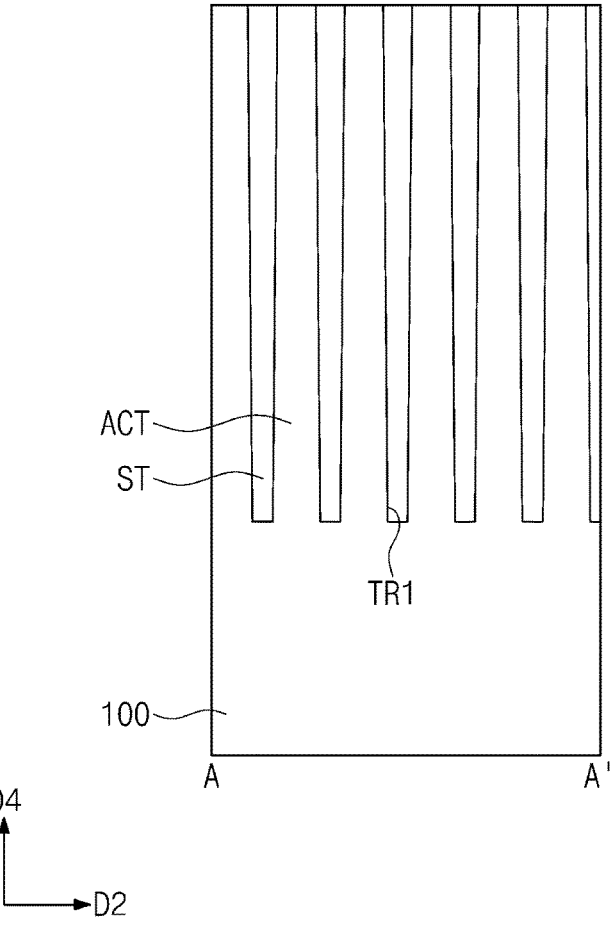
FIGS. 6A, 8A, 10A, 12A, 14A, 16A, and 18A are cross-sectional views taken along line A-A' of FIGS. 5, 7, 9, 11, 13, 15, and 17, respectively.
Figure 6B:
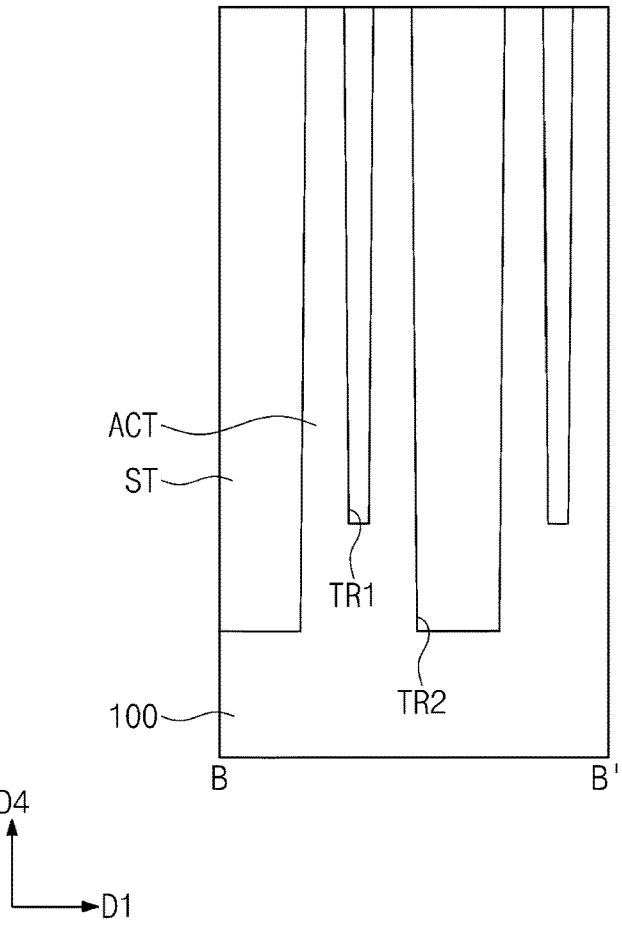
FIGS. 6B, 8B, 10B, 12B, 14B, 16B, and 18B are cross-sectional views taken along line B-B' of FIGS. 5, 7, 9, 11, 13, 15, and 17, respectively.
Figure 6C:
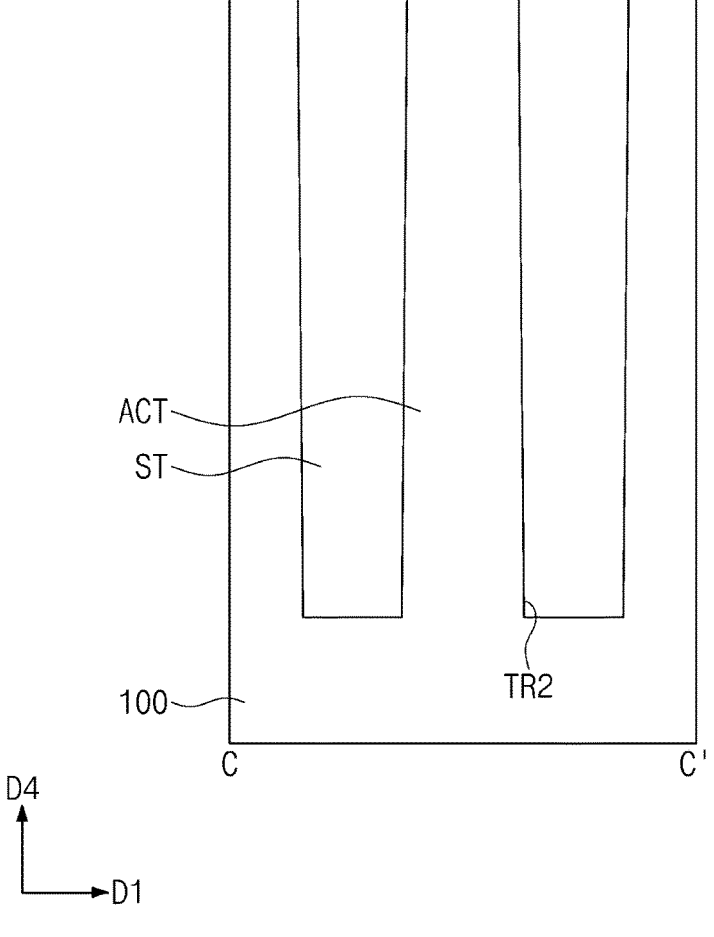
FIGS. 6C, 8C, 10C, 12C, 14C, 16C, and 18C are cross-sectional views taken along line C-C' of FIGS. 5, 7, 9, 11, 13, 15, and 17, respectively.
Figure 6D:
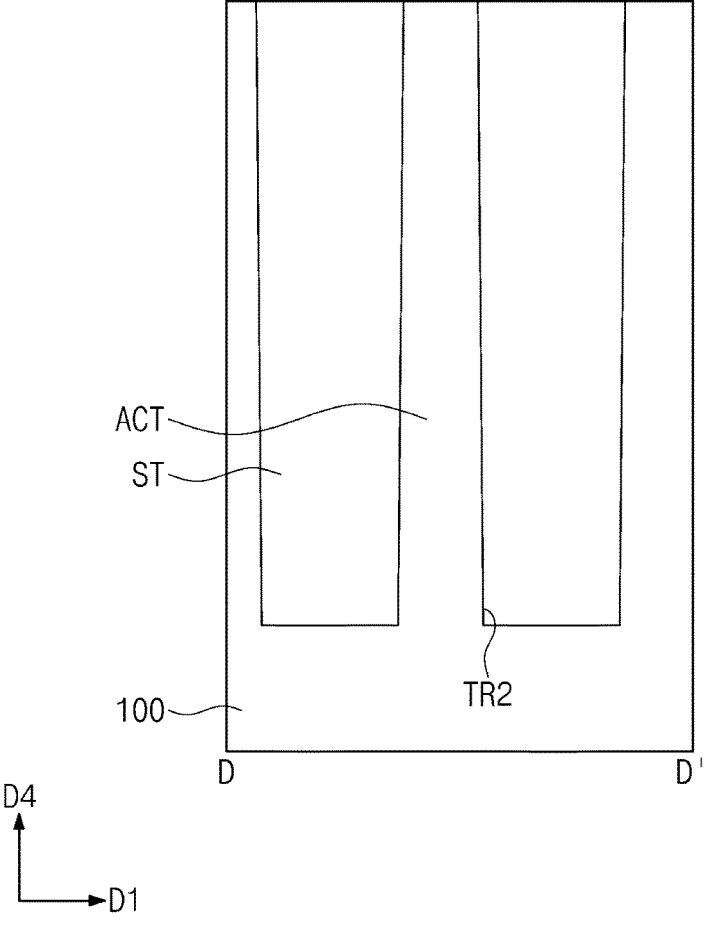
FIGS. 6D, 8D, 10D, 12D, 14D, 16D, and 18D are cross-sectional views taken along line D-D' of FIGS. 5, 7, 9, 11, 13, 15, and 17, respectively.
Figure 7:
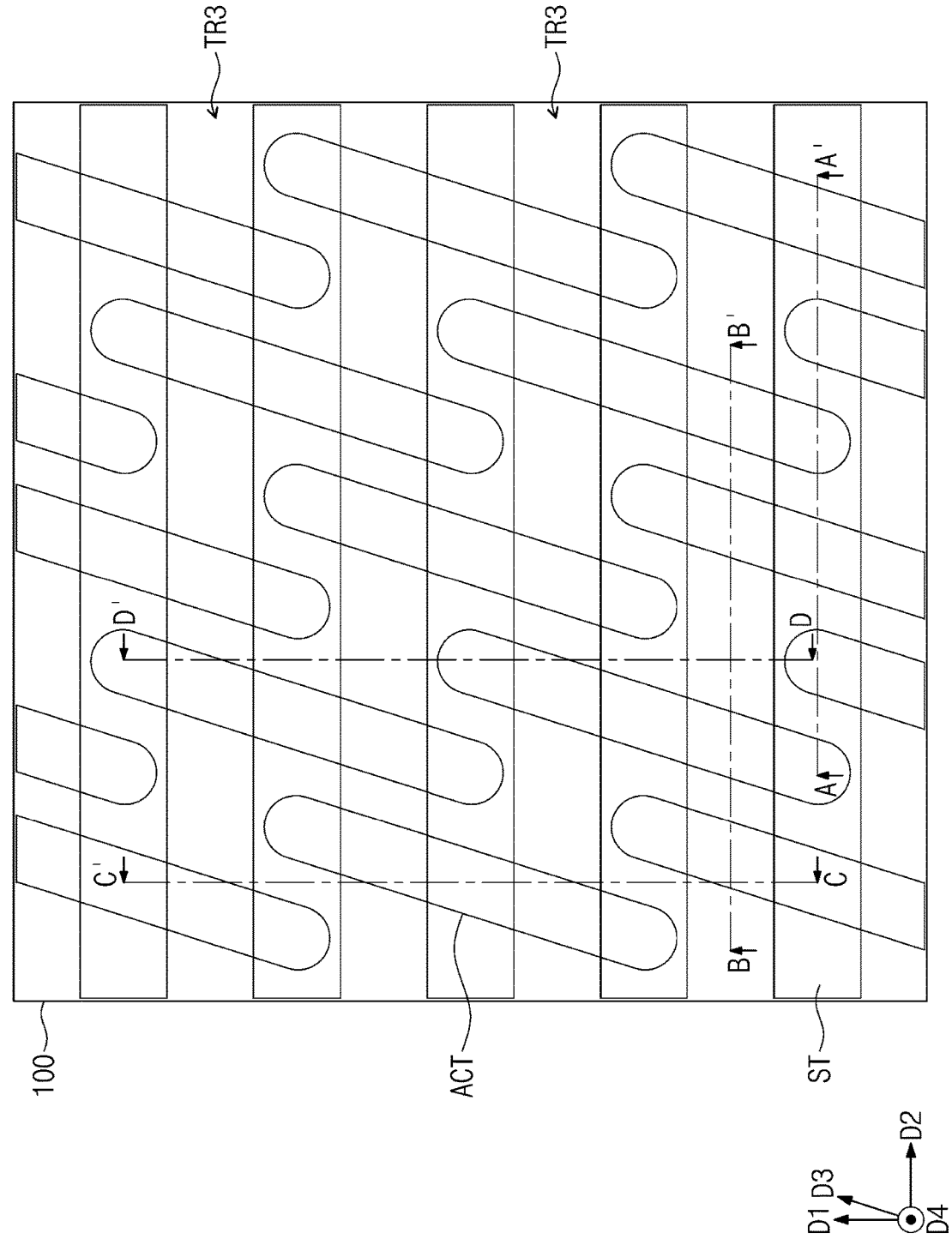
Figure 8A:
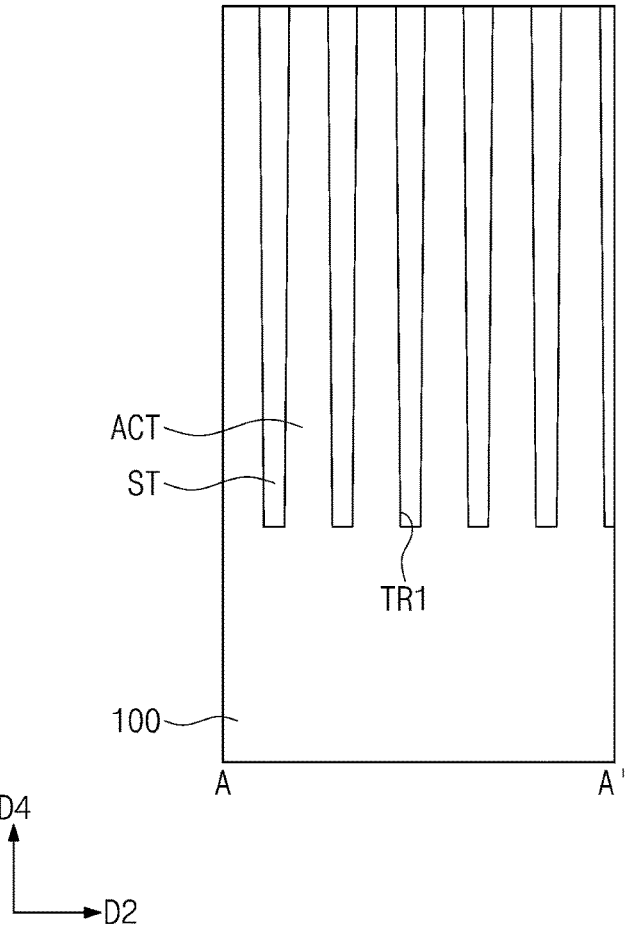
Figure 8B:
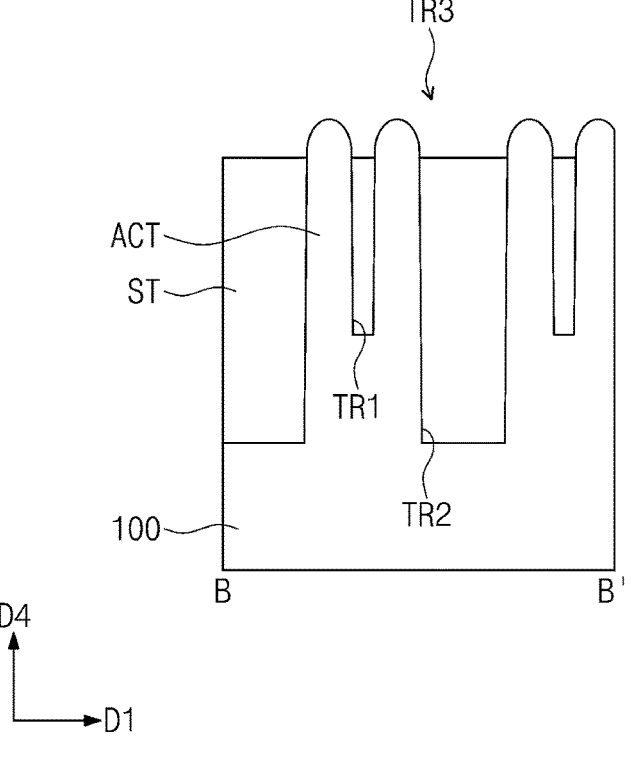
Figure 8C:
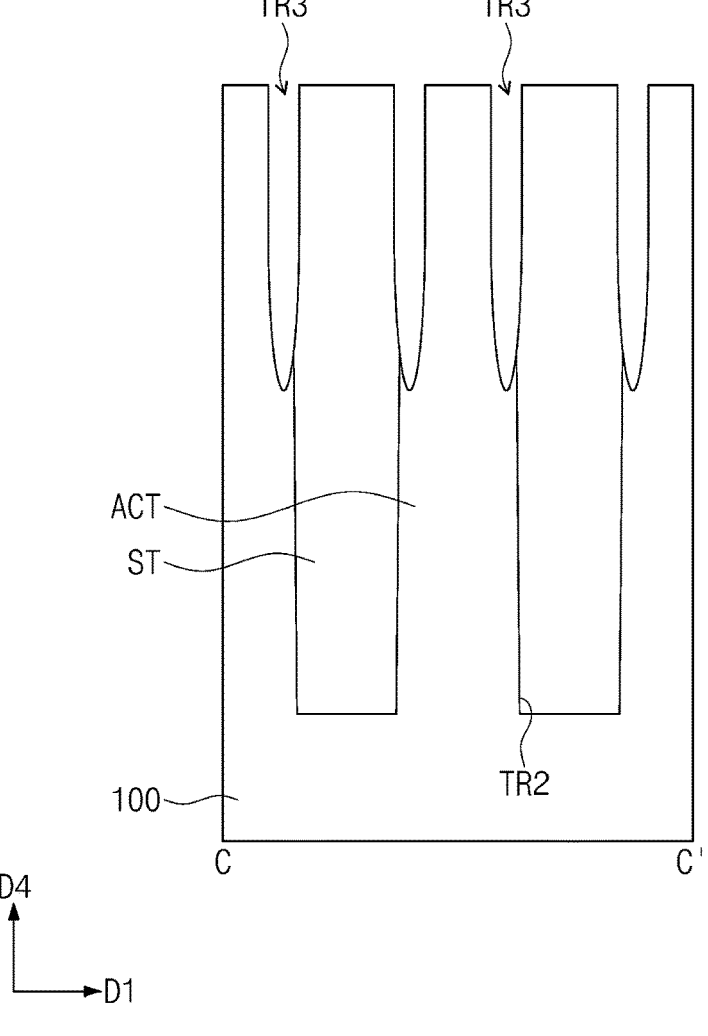
Figure 8D:
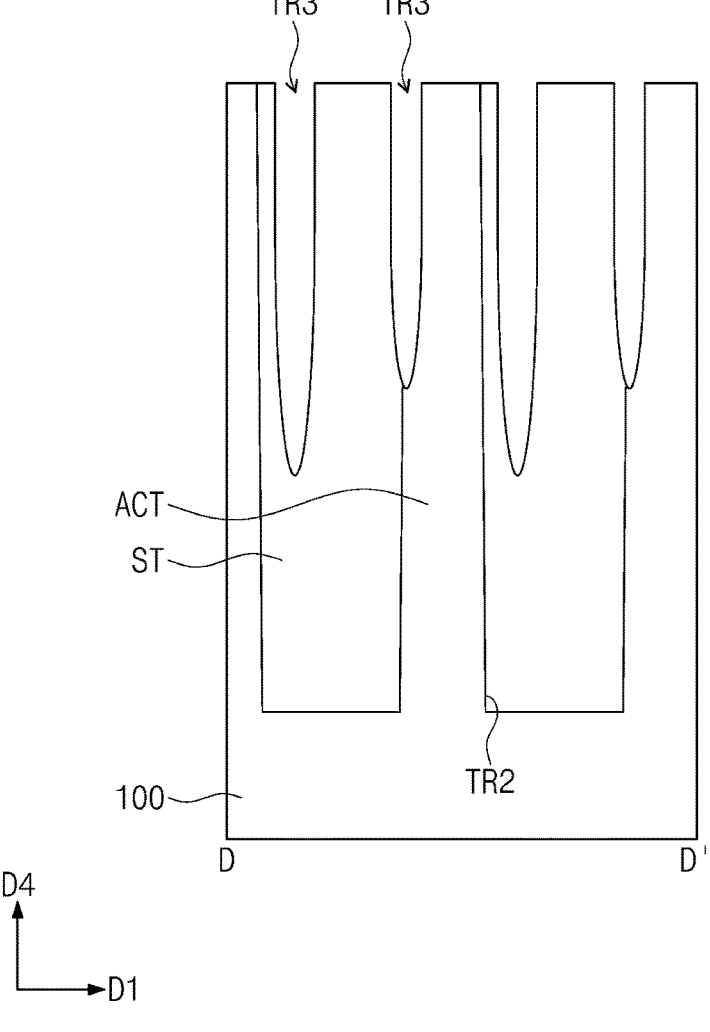
Figure 9:
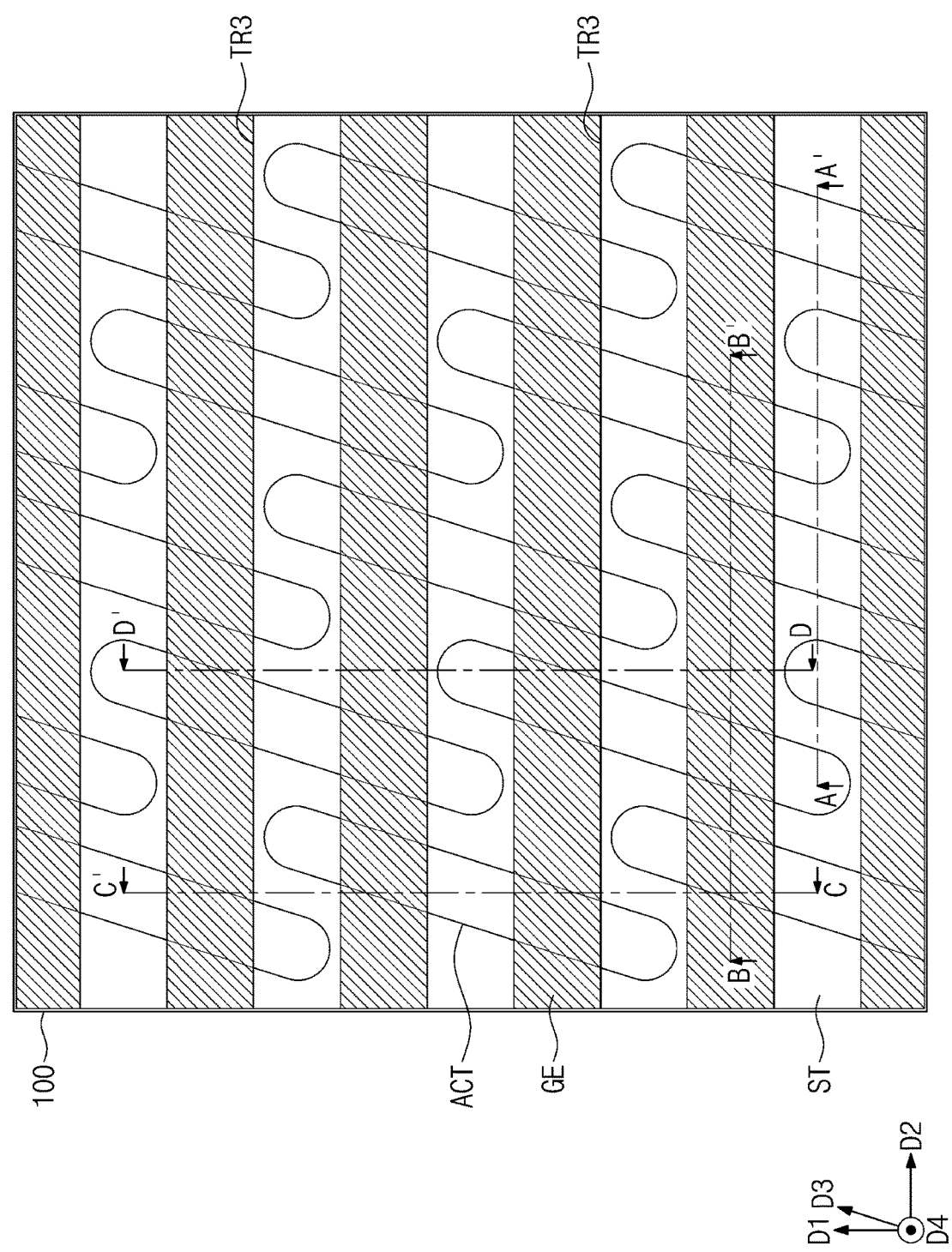
Figure 10A:
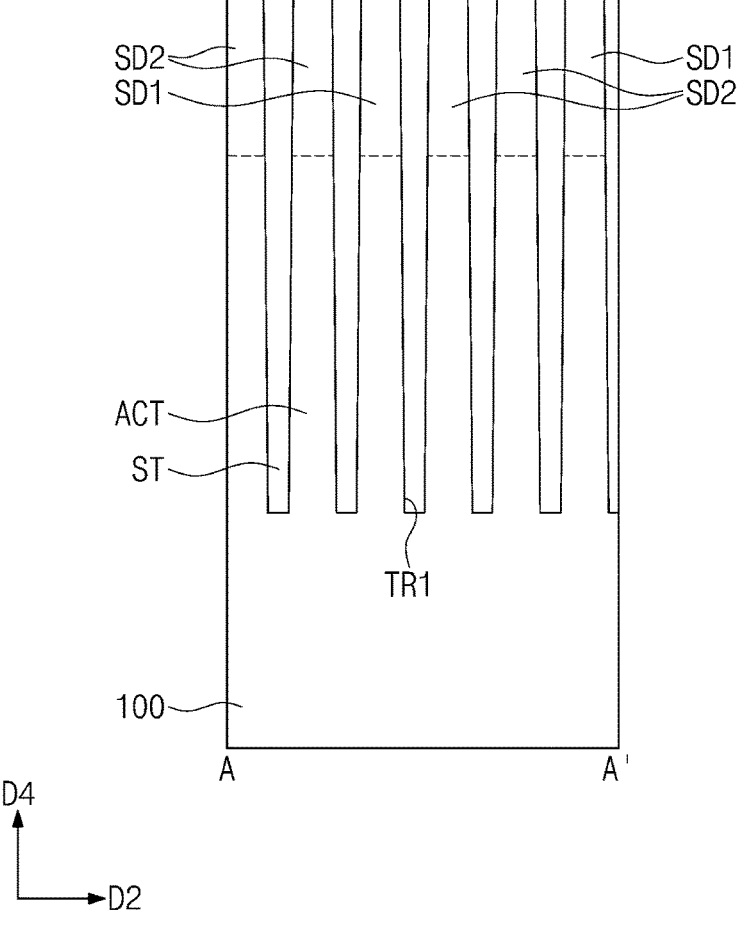
Figure 10B:
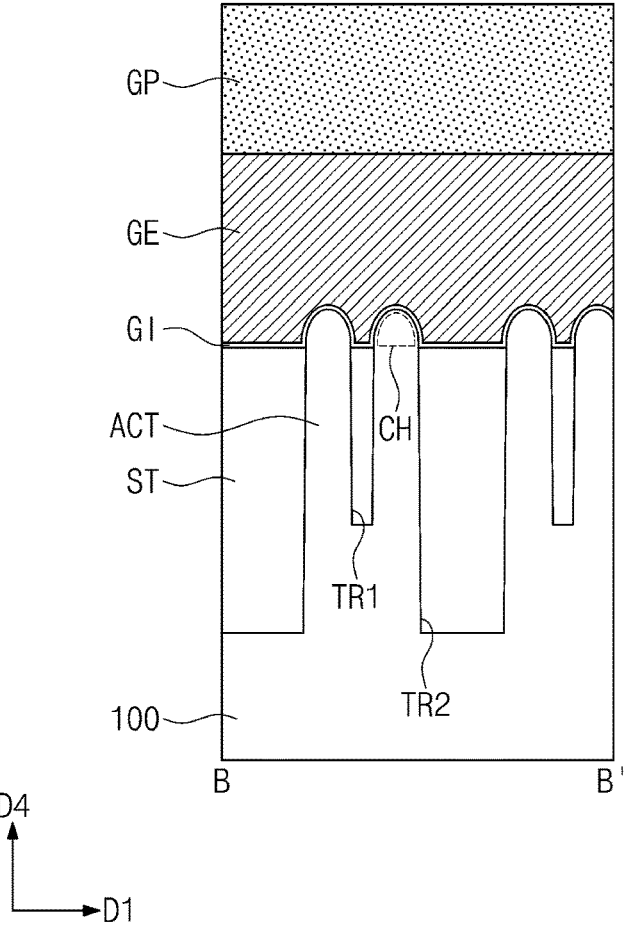
Figure 10C:
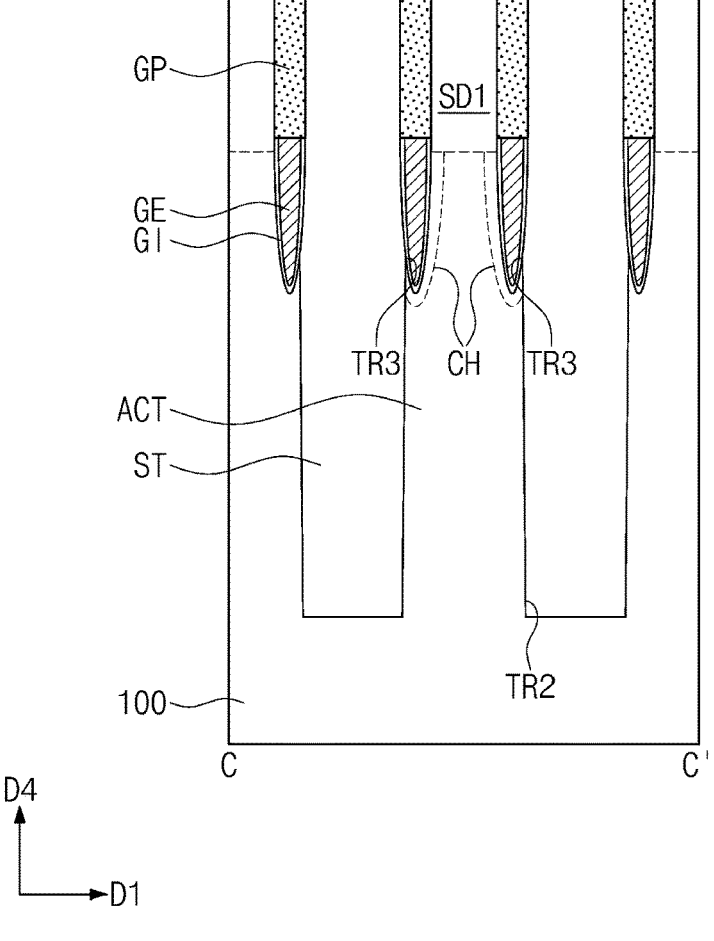
Figure 10D:
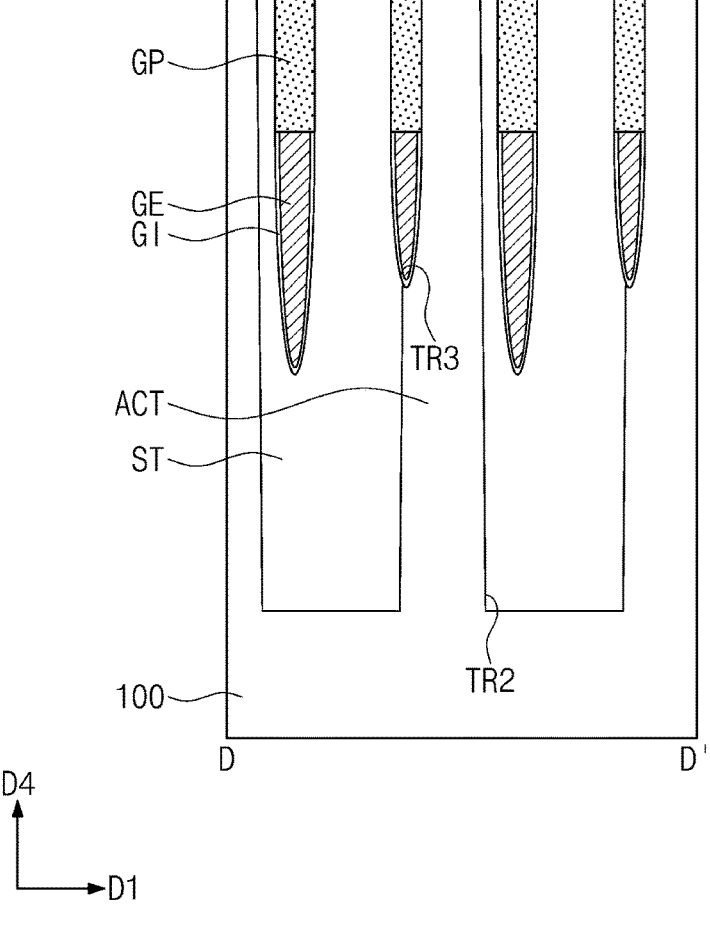

FIG. 4 is a cross-sectional view illustrating an example of an alternative to the spacer illustrated in FIG. 3. In the disclosure that follows, detailed description of technical features that are repetitive with respect to those discussed above with reference to FIGS. 1 to 3 may be omitted for purposes of clarity and/or conciseness, and differences thereof will be explained in detail.

Referring to FIG. 4, the first spacer SP1 may be omitted from the spacer SP that covers the sidewall of the line structure LST. The spacer SP may be formed of the second spacer SP2 and the third spacer SP3. For example, the second spacer SP2 may include silicon oxide, and the third spacer SP3 may include silicon nitride. The second spacer SP2 may be connected to the first lower spacer LSP1.

FIGS. 5, 7, 9, 11, 13, 15, and 17 are plan views illustrating methods of fabricating a semiconductor memory device according to some embodiments of present inventive concepts. FIGS. 6A, 8A, 10A, 12A, 14A, 16A, and 18A are cross-sectional views taken along line A-A' of FIGS. 5, 7, 9, 11, 13, 15, and 17, respectively. FIGS. 6B, 8B, 10B, 12B, 14B, 16B, and 18B are cross-sectional views taken along line B-B' of FIGS. 5, 7, 9, 11, 13, 15, and 17, respectively. FIGS. 6C, 8C, 10C, 12C, 14C, 16C, and 18C are cross-sectional views taken along line C-C' of FIGS. 5, 7, 9, 11, 13, 15, and 17, respectively. FIGS. 6D, 8D, 10D, 12D, 14D, 16D, and 18D are cross-sectional views taken along line D-D' of FIGS. 5, 7, 9, 11, 13, 15, and 17, respectively.

Referring to FIGS. 5 and 6A to 6D, an upper portion of a substrate 100 may be patterned to form active patterns ACT. Each of the active patterns ACT may extend in a third direction D3 parallel to a top surface of the substrate 100, where the third direction D3 is coincident with a longitudinal direction of the active patterns ACT. The active patterns ACT may be two-dimensionally arranged along a first direction D1 and a second direction D2. The active patterns ACT may be spaced apart from each other in the third direction D3.

First and second trenches TR1 and TR2 may be defined between the active patterns ACT. The first trench TR1 may be defined between a pair of active patterns ACT that are adjacent to each other in the second direction D2. The second trench TR2 may be defined between a pair of active patterns ACT that are adjacent to each other in the third direction D3.

According to an embodiment of present inventive concepts, the patterning process used to form the active patterns ACT may include a lithography process that uses an extreme ultraviolet (EUV) radiation. In the present disclosure, EUV may mean an ultraviolet ray/radiation having a wavelength in the range of about 4 nm to about 124 nm, and more particularly in the range of about 4 nm to about 20 nm, and still more particularly about 13.5 nm. EUV may denote light whose energy is in the range of about 6.21 eV to about 124 eV, and more particularly, in the range of about 90 eV to about 95 eV.

The EUV lithography process may include exposure and development processes that use EUV irradiated on a photoresist layer. For example, the photoresist layer may be an organic photoresist that contains an organic polymer, such as polyhydroxystyrene. The organic photoresist may further include a photosensitive compound sensitive to the EUV. The organic photoresist may additionally include a material whose EUV absorption coefficient is high, for example, an organometallic material, an iodine-containing material, and/or a fluorine-containing material. For another example, the photoresist layer may be an inorganic photoresist that contains an inorganic material, such as tin oxide.

The photoresist layer may be formed to have a relatively small thickness. The photoresist layer exposed to the EUV may be developed to form photoresist patterns. When viewed in plan, the photoresist patterns may have a linear shape that extends in one direction, an island shape, a zigzag shape, a honeycomb shape, or a circular shape, but present inventive concepts are not limited to a particular example.

The photoresist patterns may be used as an etching mask to pattern one or more mask layers that are stacked below the photoresist patterns, and thus mask patterns may be formed. The mask patterns may be used as an etching mask to pattern a target layer to form desired patterns on a wafer.

In a comparative example, a multi-patterning technique (MPT) may require the use of two or more photomasks to form fine-pitched patterns on a wafer. In contrast, when an EUV lithography process is performed according to some embodiments of present inventive concepts, only a single photomask may be enough to form fine-pitched active patterns ACT.

For example, about 45 nm or less may be given as a minimum pitch between the active patterns ACT achieved using EUV lithography processes according to present embodiments of inventive concepts. Hence, EUV lithography may be sufficient such that the active patterns ACT are formed as delicate fine patterns without requiring a multi-patterning technique.

A device isolation layer ST may be formed to fill the first and second trenches TR1 and TR2. The device isolation layer ST may be formed to completely fill the first and second trenches TR1 and TR2 and to cover the active patterns ACT. A planarization process may be performed on the device isolation layer ST until top surfaces of the active patterns ACT are exposed.

Referring to FIGS. 7 and 8A to 8D, the active patterns ACT and the device isolation layer ST may be patterned to form third trenches TR3. When viewed in plan, each of the third trenches TR3 may have a linear shape that extends in the second direction D2.

The formation of the third trenches TR3 may include forming a hardmask pattern that has openings, and then using the hardmask pattern as an etching mask to etch the exposed active patterns ACT and the device isolation layer ST. The third trench TR3 may be formed shallower than the first trench TR1.

Referring to FIGS. 9 and 10A to 10D, a gate dielectric layer GI, a gate electrode GE, and a gate capping layer GP may be sequentially formed in each of the third trenches TR3. For example, the gate dielectric layer GI may be conformally formed in the third trench TR3. The gate dielectric layer GI may include one or more of a silicon oxide layer, a silicon nitride layer, a silicon oxynitride layer, and/or a high-k dielectric material.

The gate electrode GE may be formed by forming on the gate dielectric layer GI a conductive layer that fills the third trench TR3. The conductive layer may include one or more of metal and conductive metal nitride.

The gate dielectric layer GI and the gate electrode GE may be recessed, and then the gate capping layer GP may be formed on the recessed gate electrode GE. The gate capping layer GP may have a top surface coplanar with that of the active pattern ACT.

The active patterns ACT may undergo an ion implantation process to form a first source/drain region SD1 and a pair of second source/drain regions SD2 on an upper portion of the active pattern ACT. The pair of second source/drain regions SD2 may be spaced apart in the third direction D3 from each other across the first source/drain region SD1. For example, the first and second source/drain regions SD1 and SD2 may be doped with the same impurity.

A channel region CH may be defined on the active pattern ACT positioned below the gate electrode GE. When viewed in plan, the channel region CH may be interposed between the first source/drain region SD1 and the second source/drain region SD2. The gate electrode GE may be provided on a top surface and opposite sidewalls of the channel region CH (see FIG. 10B).

Referring to FIGS. 11 and 12A to 12D, a dielectric layer IL may be formed on an entire surface of the substrate 100. For example, the dielectric layer IL may have a multi-layered structure in which a silicon oxide layer and a silicon oxynitride layer are stacked. The dielectric layer IL may be patterned to form first contact holes CNH1 that correspondingly expose the first source/drain regions SD1 of the active patterns ACT.

When viewed in plan, the first contact hole CNH1 may have an oval shape whose diameter in the first direction D1 is less than that in the second direction D2. The first contact holes CNH1 may be formed arranged in a zigzag fashion. In some embodiments of present inventive concepts, the first contact holes CNH1 may be formed by using an extreme ultraviolet (EUV) lithography process. The EUV lithography process may be substantially the same as that used to form the active patterns ACT discussed with reference to FIGS. 5 and 6A to 6D.

Figure 11:
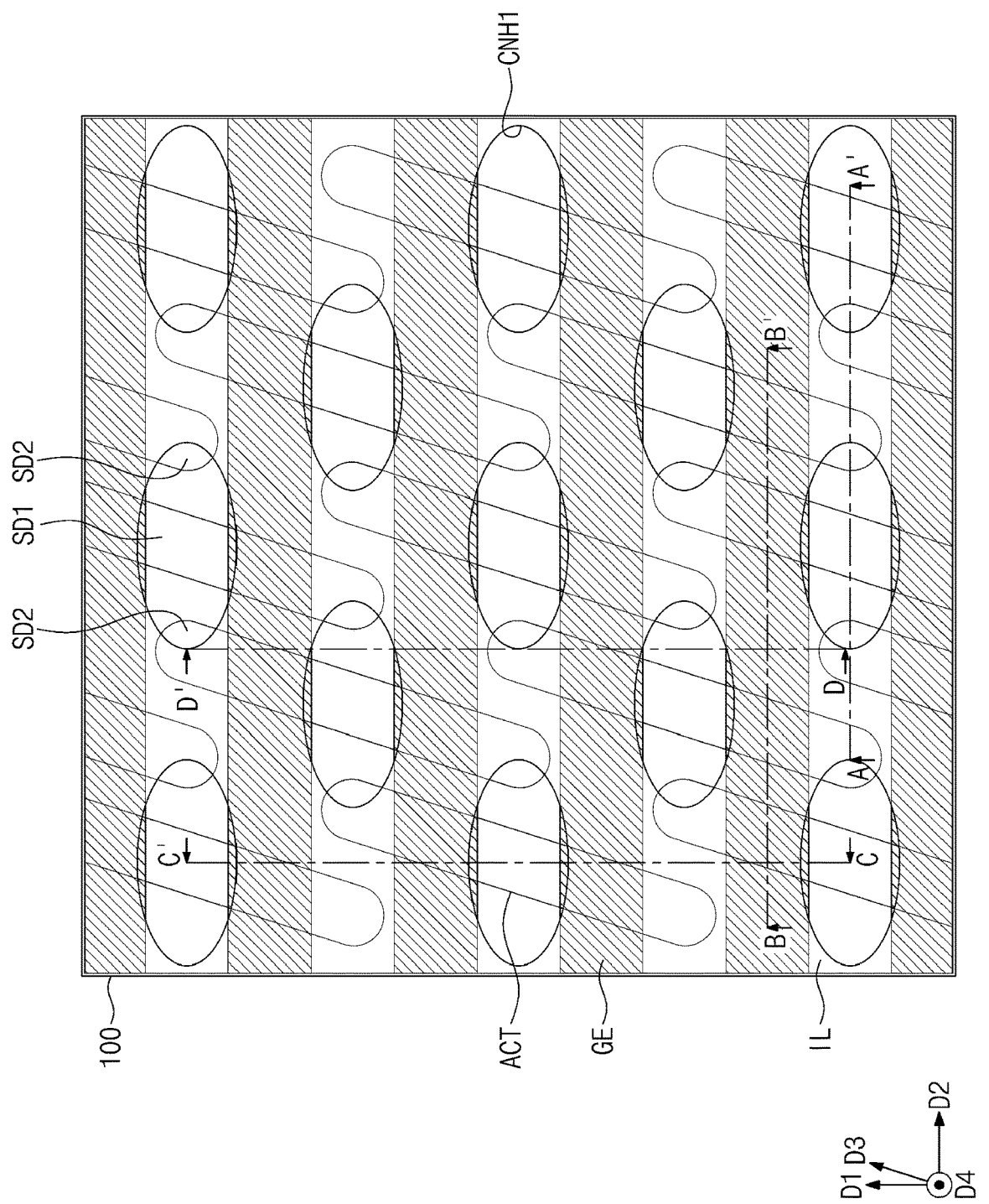
Figure 12A:
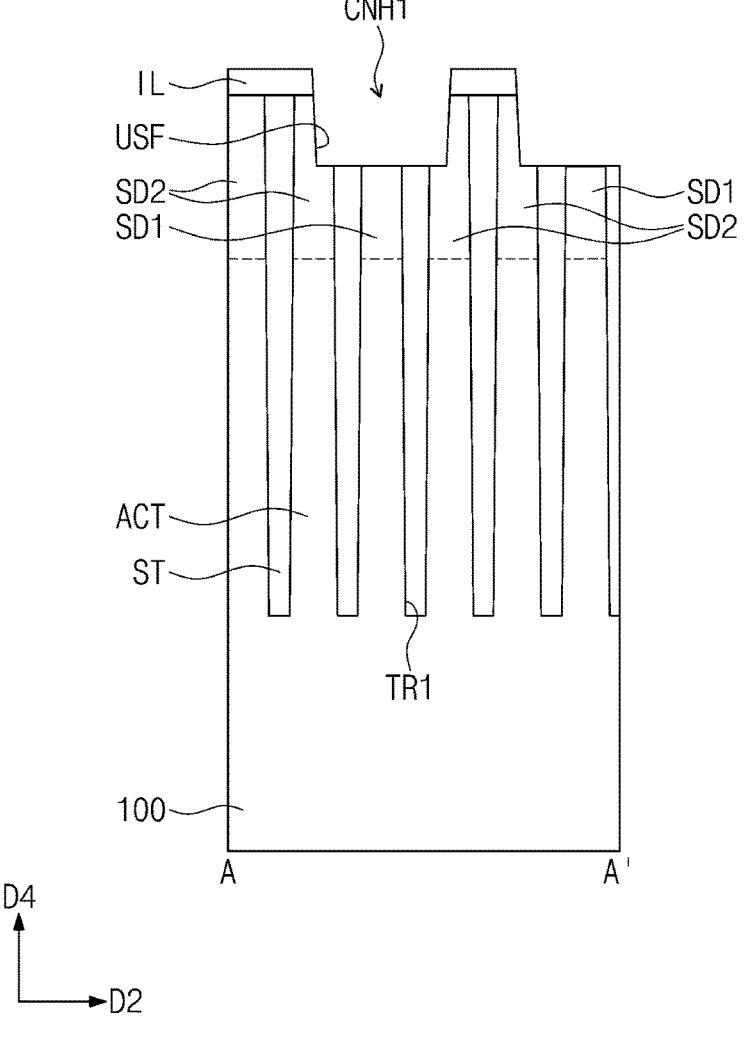
Figure 12B:
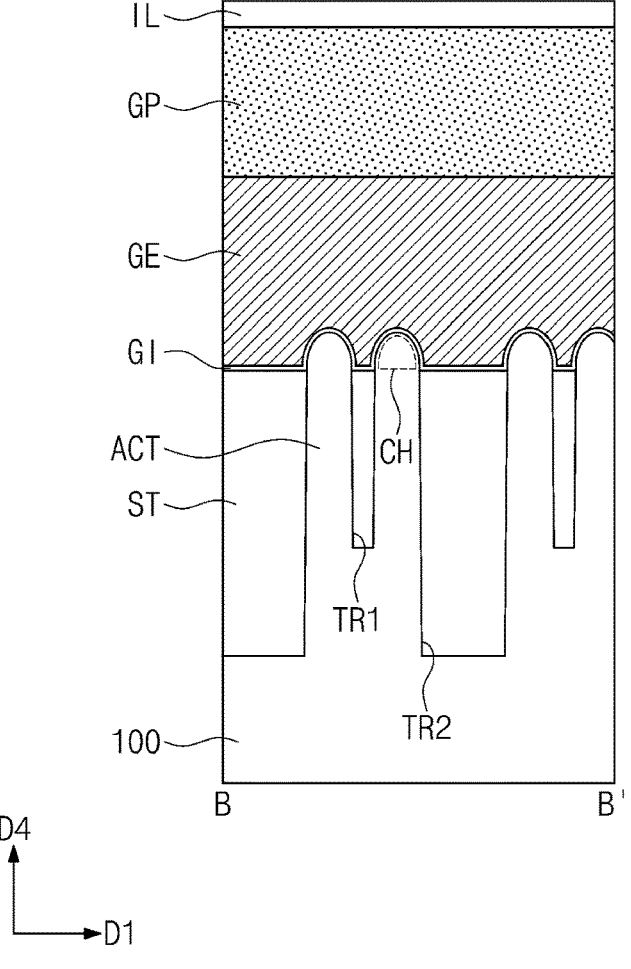
Figure 12C:
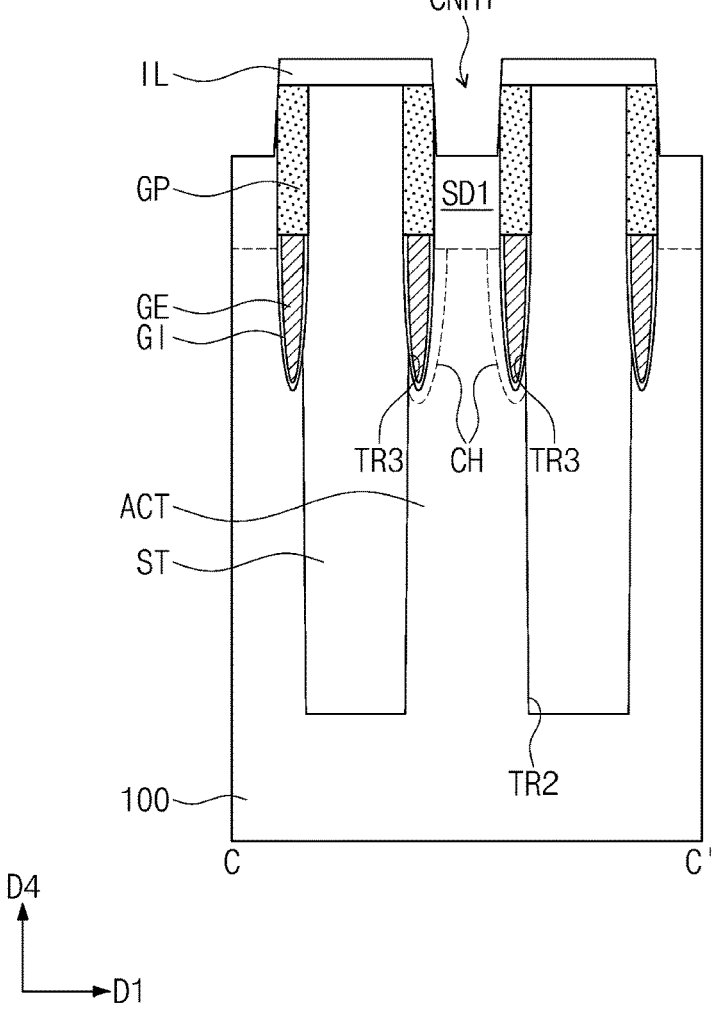
Figure 12D:
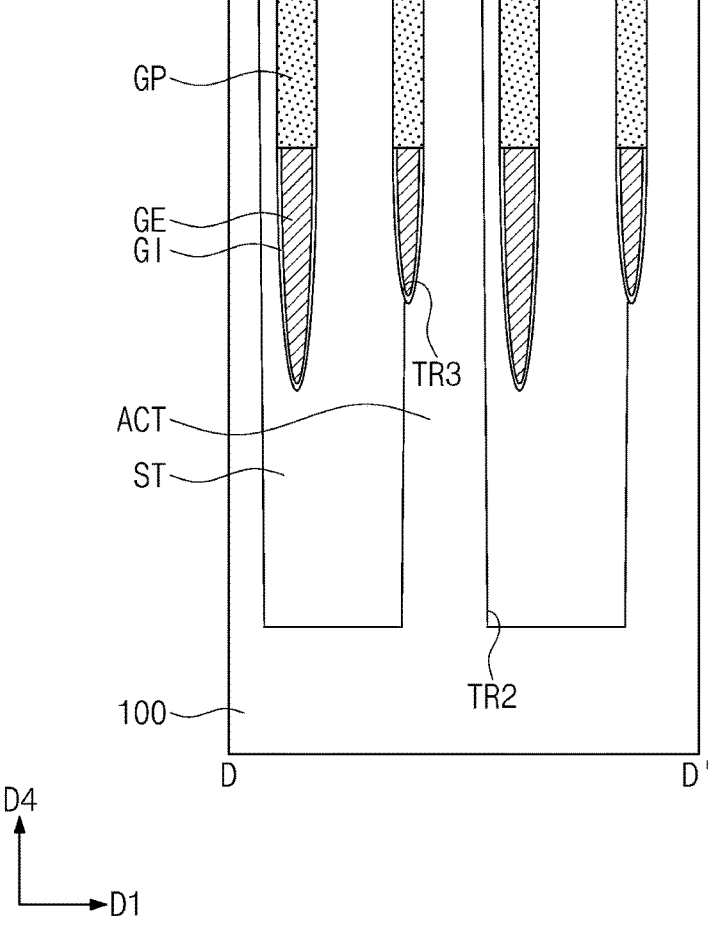
Figure 13:
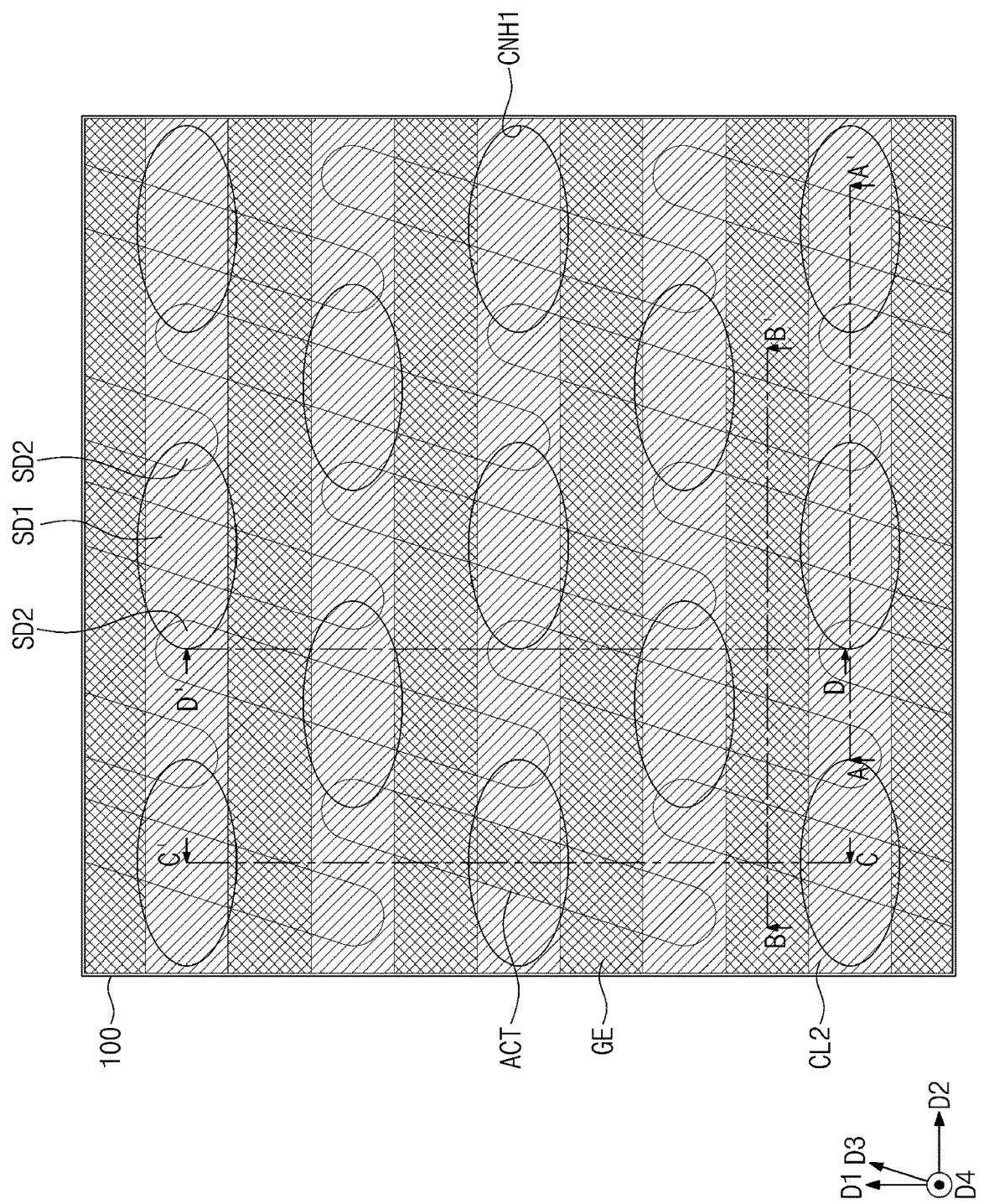
Figure 14A:
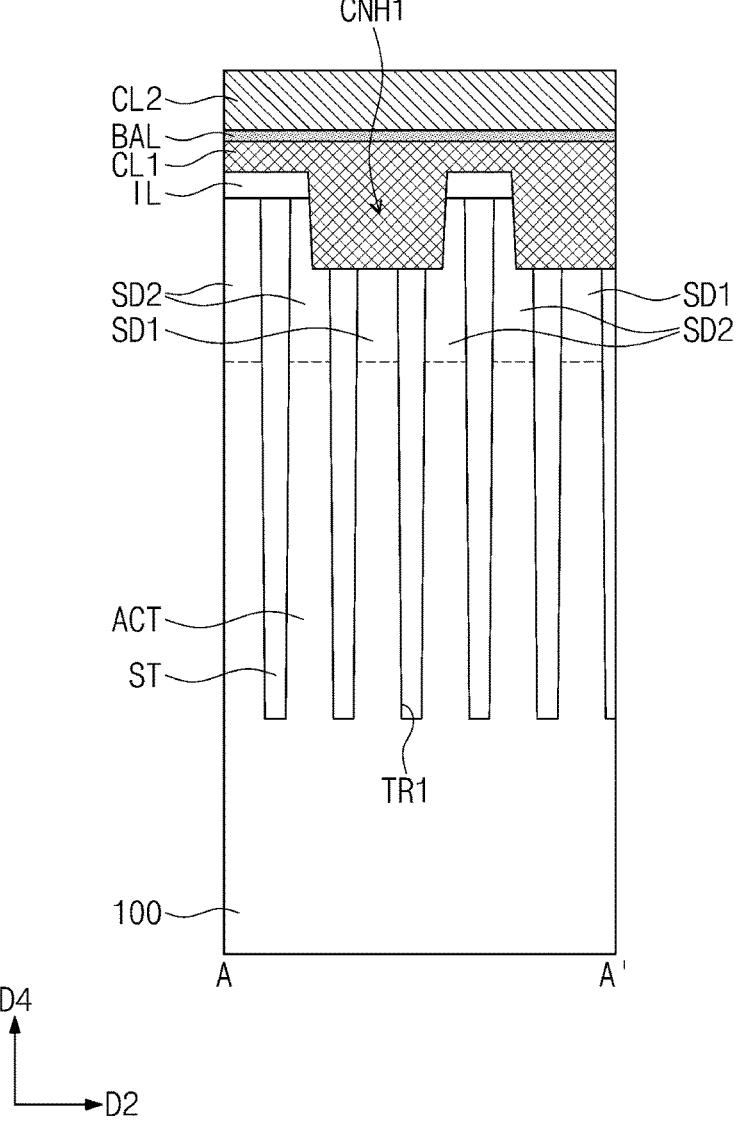
Figure 14B:
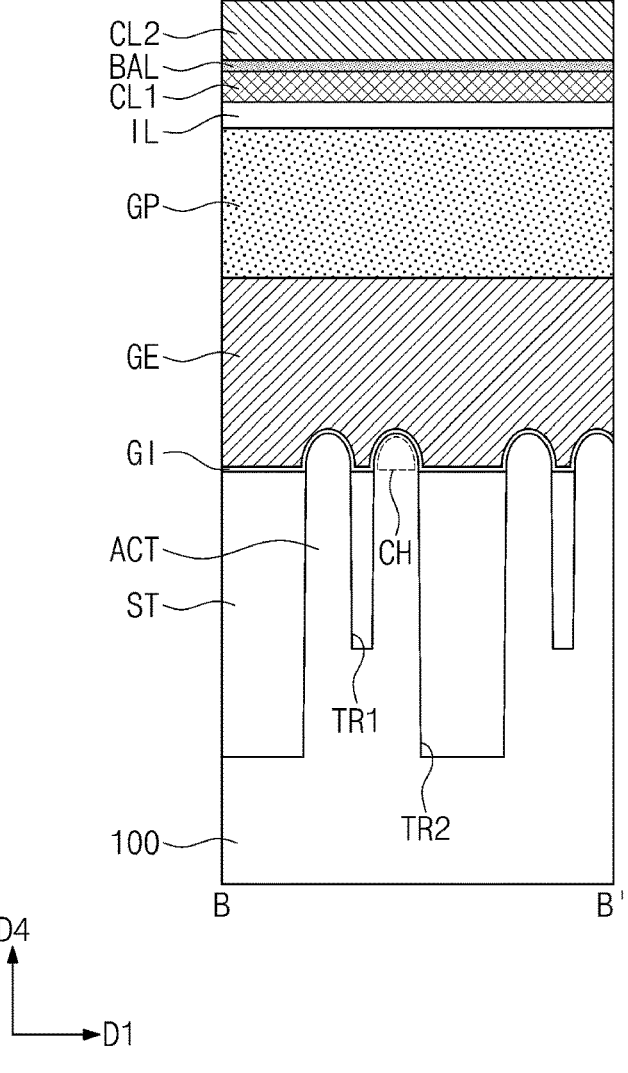
Figure 14C:
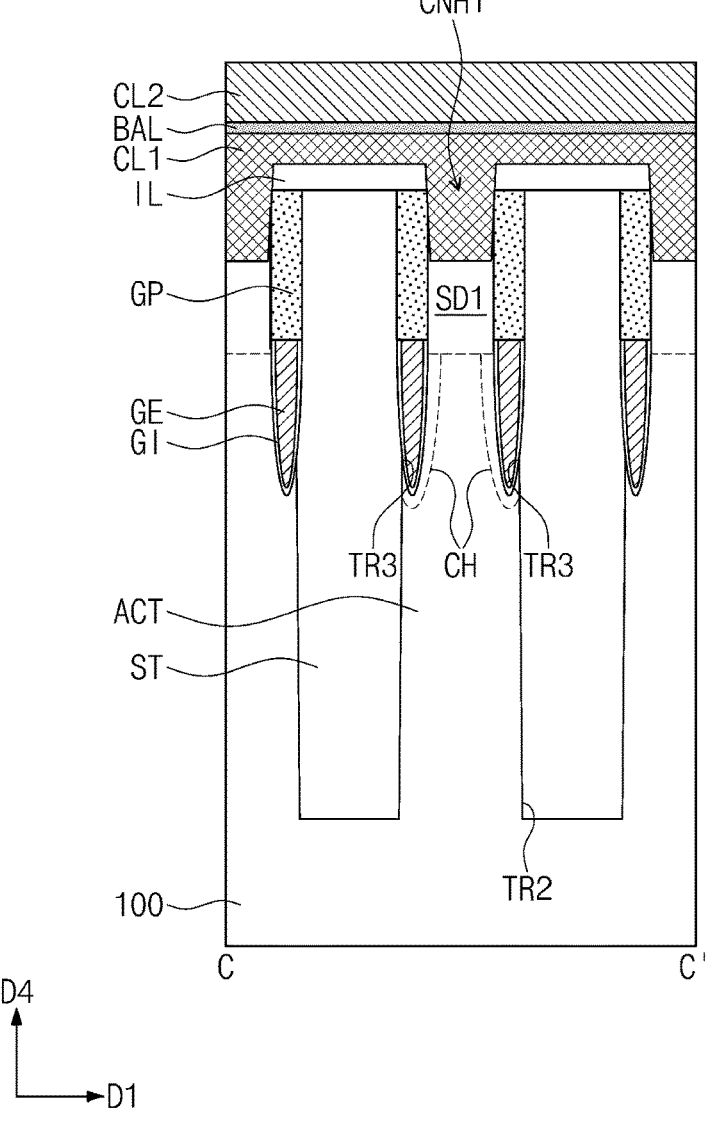
Figure 14D:
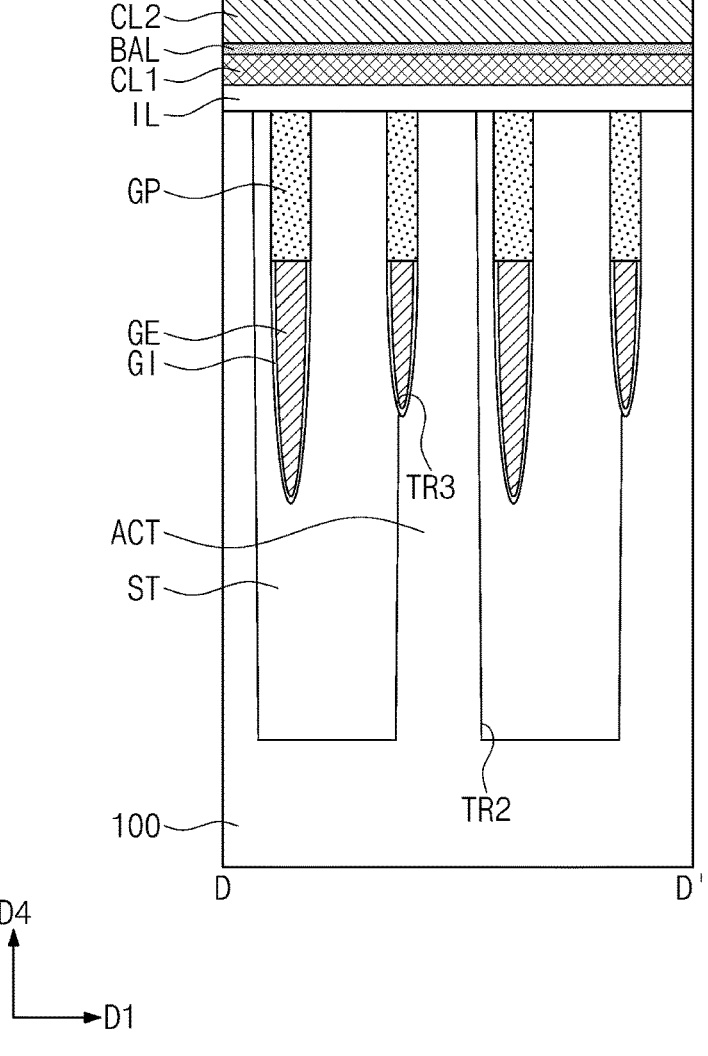

The first contact hole CNH1 according to some embodiments of present inventive concepts may expose not only the first source/drain region SD1, but also a portion of at least one second source/drain region SD2 adjacent to the first source/drain region SD1 (see FIGS. 11 and 12A). For example, the first contact hole CNH1 may expose the first source/drain region SD1 and a pair of second source/drain regions SD2 adjacent to opposite sides of the first source/drain region SD1. The first source/drain region SD1 and the second source/drain region SD2 that are exposed by a same first contact hole CNH1 may be positioned in/on different active patterns ACT from each other.

When the first contact hole CNH1 is formed, an upper portion of the first source/drain region SD1 may be recessed. At least one second source/drain region SD2 exposed by the first contact hole CNH1 may also be recessed at an upper portion thereof. Therefore, the first contact hole CNH1 may expose a recessed upper lateral surface USF of the second source/drain region SD2 (see FIG. 12A). The dielectric layer IL may cover a remaining non-exposed portion of the second source/drain region SD2. When the first contact hole CNH1 is formed, the device isolation layer ST between the first and second source/drain regions SD1 and SD2 may be recessed at an upper portion thereof.

Referring to FIGS. 13 and 14A to 14D, a first conductive layer CL1, a barrier layer BAL, and a second conductive layer CL2 may be sequentially formed on the dielectric layer IL. The first conductive layer CL1 may fill the first contact holes CNH1. For example, the first conductive layer CL1 may be in contact with the first source/drain region SD1 exposed by the first contact hole CNH1 and with a pair of second source/drain regions SD2 adjacent to the first source/drain region SD1. For example, the first conductive layer CL1 may include a doped semiconductor material.

The barrier layer BAL may be formed to lie between the first conductive layer CL1 and the second conductive layer CL2. For example, the barrier layer BAL may include conductive metal nitride, and the second conductive layer CL2 may include a metallic material. The barrier layer BAL may reduce and/or suppress diffusion of metallic material from the second conductive layer CL2 to the first conductive layer CL1.

Referring to FIGS. 15 and 16A to 16D, line structures LST may be formed to extend in parallel to each other in the first direction D1 on the dielectric layer IL. The line structures LST may be arranged along the second direction D2.

For example, mask patterns MP may be formed on the second conductive layer CL2. The mask patterns MP may be formed to have linear shapes that extend in the first direction D1. For example, the mask patterns MP may include a silicon nitride layer and/or a silicon oxynitride layer.

The mask patterns MP may be used as an etching mask to sequentially etch the second conductive layer CL2, the barrier layer BAL, and the first conductive layer CL1 to respectively form a bit line BL, a barrier pattern BP, and a conductive pattern CP. The mask pattern MP, the bit line BL, the barrier pattern BP, and the conductive pattern CP may vertically overlap each other. The mask pattern MP, the bit line BL, the barrier pattern BP, and the conductive pattern CP may constitute the line structure LST. When viewed in plan, the bit lines BL may extend while intersecting the gate electrodes GE.

The conductive pattern CP may include contact parts CNP that correspondingly fill the first contact holes CNH1. The conductive pattern CP may be connected through the contact part CNP to the first source/drain region SD1. For example, the bit line BL may be electrically connected through the conductive pattern CP to the first source/drain region SD1.

Portions of the first conductive layer CL1 in the first contact hole CNH1 that are in contact with a pair of second source/drain regions SD2 may be completely removed during a patterning process (e.g., an anisotropic etching process) of the first conductive layer CL1. For example, as the first contact hole CNH1 may have a large diameter in the second direction D2, a sufficient space may be obtained to achieve the complete removal of the portions of the first conductive layer CL1 that are in contact with the pair of second source/drain regions SD2.

The contact part CNP may be provided on its opposite sidewalls with a pair of lower spacers LSP that are formed to fill the first contact hole CNH1. A pair of spacers SP may be formed on the pair of lower spacers LSP. The pair of spacers SP may correspondingly cover opposite sidewalls of the line structure LST. The formation of the pair of spacers SP may include conformally forming a spacer layer on the entire surface of the substrate 100 and anisotropically etching the spacer layer.

The spacers SP and the mask patterns MP may be used as a mask to perform on the entire surface of the substrate 100 an etching process to form second contact holes CNH2 that correspondingly expose the second source/drain regions SD2. For example, the second contact hole CNH2 may penetrate the dielectric layer IL to extend downwardly from the top surface of the substrate 100. When the second contact hole CNH2 is formed, the lower spacer LSP may be recessed. Therefore, the second contact hole CNH2 may expose the second source/drain region SD2.

Figure 15:
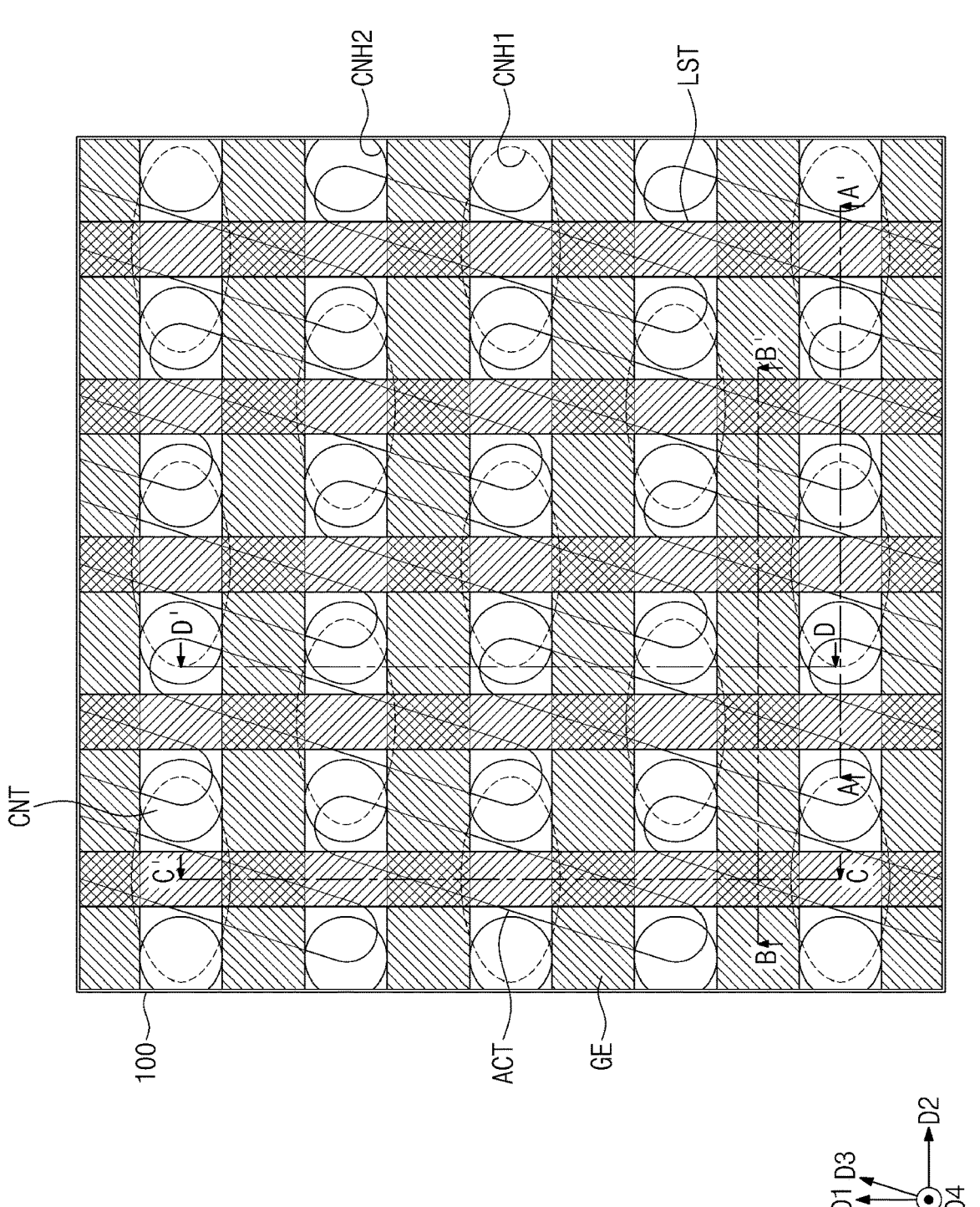
Figure 19:
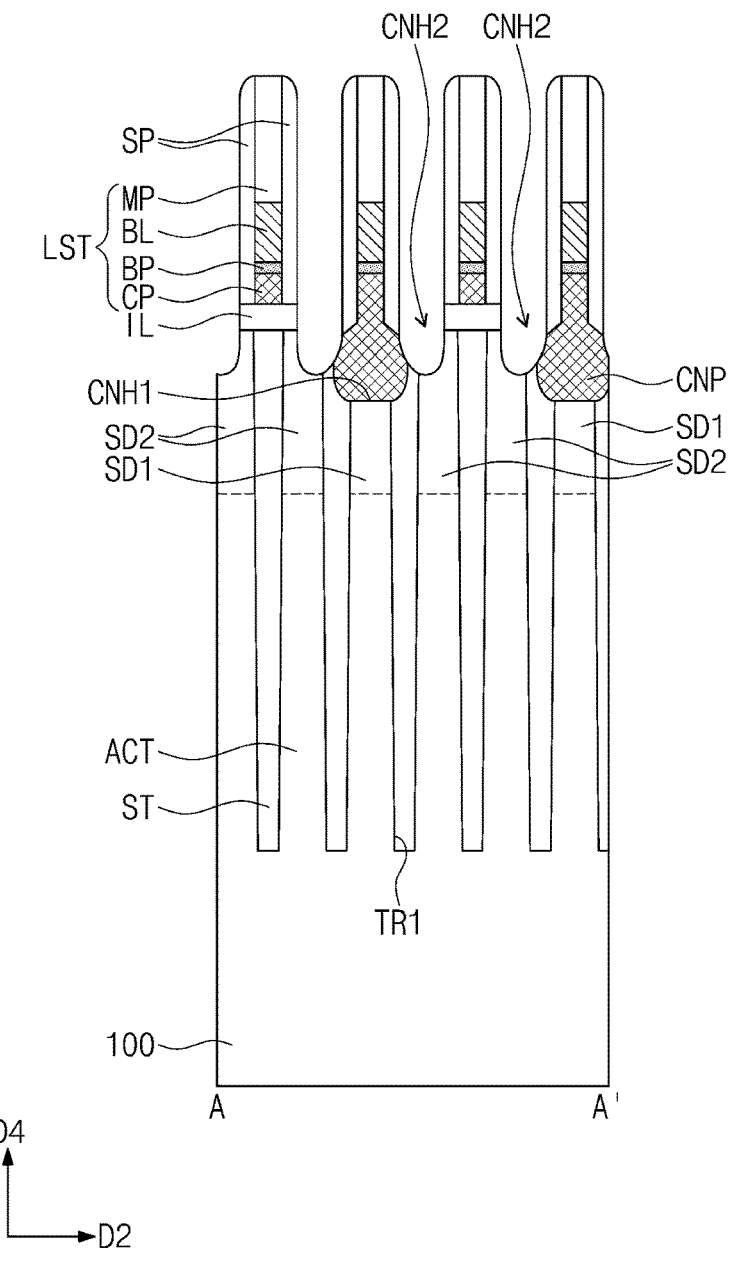
FIG. 19 is a cross-sectional view taken along line A-A' of FIG. 15, illustrating operations of a method of fabricating a semiconductor device according to a comparative example of present inventive concepts.

FIG. 19 is a cross-sectional view taken along line A-A' of FIG. 15, illustrating a method of fabricating a semiconductor device according to a comparative example according to some embodiments of present inventive concepts. Referring to FIG. 19, a first contact hole CNH1 according to a comparative example of some embodiments of present inventive concepts may be formed to have a size that never exposes the second source/drain region SD2. In this case, a diameter in the second direction D2 of the first contact hole CNH1 depicted in FIG. 19 may be less than a diameter in the second direction D2 of the first contact hole CNH1 depicted in FIG. 16a.

A process (or anisotropic etching process) that patterns the first conductive layer CL1 may form a contact part CNP in the first contact hole CNH1. According to a comparative example, as the first contact hole CNH1 has a relatively small diameter in the second direction D2, the first conductive layer CL1 filling the first contact hole CNH1 may be rarely etched. Thus, the first conductive layer CL1 in the first contact hole CNH1 may almost remain unchanged.

Second contact holes CNH2 may be formed to correspondingly expose the second source/drain regions SD2. The second contact holes CNH2 may expose the contact part CNP as well as the second source/drain region SD2. This may be because the first contact layer CL filling the first contact hole CNH1 almost remains to form the contact part CNP having a relatively large width.

Afterwards, when a contact CNT is formed in the second contact hole CNH2, the contact CNT may be connected not only to the second source/drain region SD2, but to the contact part CNP. This may cause a short-circuit failure in the resulting semiconductor device. Accordingly, reliability of a semiconductor device according to the comparative example may be reduced.

In contrast, the first contact hole CNH1 according to some embodiments of present inventive concepts may be formed to have an oval shape having a relatively large diameter in the second direction D2. Thus, process defects (such as an abrupt increase in width at a lower portion of the contact part CNP) in the contact part CNP may be reduced and/or prevented in a process used to form the line structure LST. Accordingly, the second contact hole CNH2 may stably expose only the second source/drain region SD2 (see FIG. 16A). As a result, according to some embodiments of present inventive concepts, semiconductor devices may be provided with reduced failure and/or increased reliability.

Referring to FIGS. 17 and 18A to 18D, a plurality of dielectric fences IFS may be formed on the gate capping layer GP. The dielectric fences IFS may not overlap the second contact holes but may instead expose the second contact holes CNH2.

The second contact holes CNH2 may be filled with a conductive material to form contacts CNT in corresponding second contact holes CNH2. The contacts CNT may be connected to the second source/drain regions SD2. For example, the conductive material filling the second contact holes CNH2 may be a doped semiconductor material.

For example, the conductive material may be formed on the entire surface of the substrate 100, and then the conductive material may be recessed to have a top surface lower than top surfaces of the dielectric fences IFS. The dielectric fences IFS may divide the conductive material into pieces, and thus the contacts CNT may be correspondingly formed in the second contact holes CNH2. The contacts CNT and the dielectric fences IFS may be alternately arranged along the first direction D1.

Referring back to FIGS. 1 and 2A to 2D, landing pads LP may be correspondingly formed on the contacts CNT. For example, a metal layer may be formed on the contacts CNT and the dielectric fences IFS. The metal layer may be patterned to form a plurality of landing pads LP. A space between the plurality of landing pads LP may be filled with a dielectric material to form a dielectric pattern INP.

In some embodiments of present inventive concepts, the landing pads LP may be formed by using an extreme ultraviolet (EUV) lithography process. The EUV lithography process may be substantially the same as the EUV lithography process used to form the active patterns ACT discussed above with reference to FIGS. 5 and 6A to 6D.

First electrodes LEL may be correspondingly formed on the landing pads LP. A dielectric layer HDL may be conformally formed on the first electrodes LEL. A second electrode TEL may be formed on the dielectric layer HDL. The first electrode LEL, the dielectric layer HDL, and the second electrode TEL may constitute a data storage element DS, for example, a capacitor. Although not shown, wiring layers (e.g., M1, M2, M3, M4, and the like) may be stacked on the second electrode TEL.

Figure 16A:
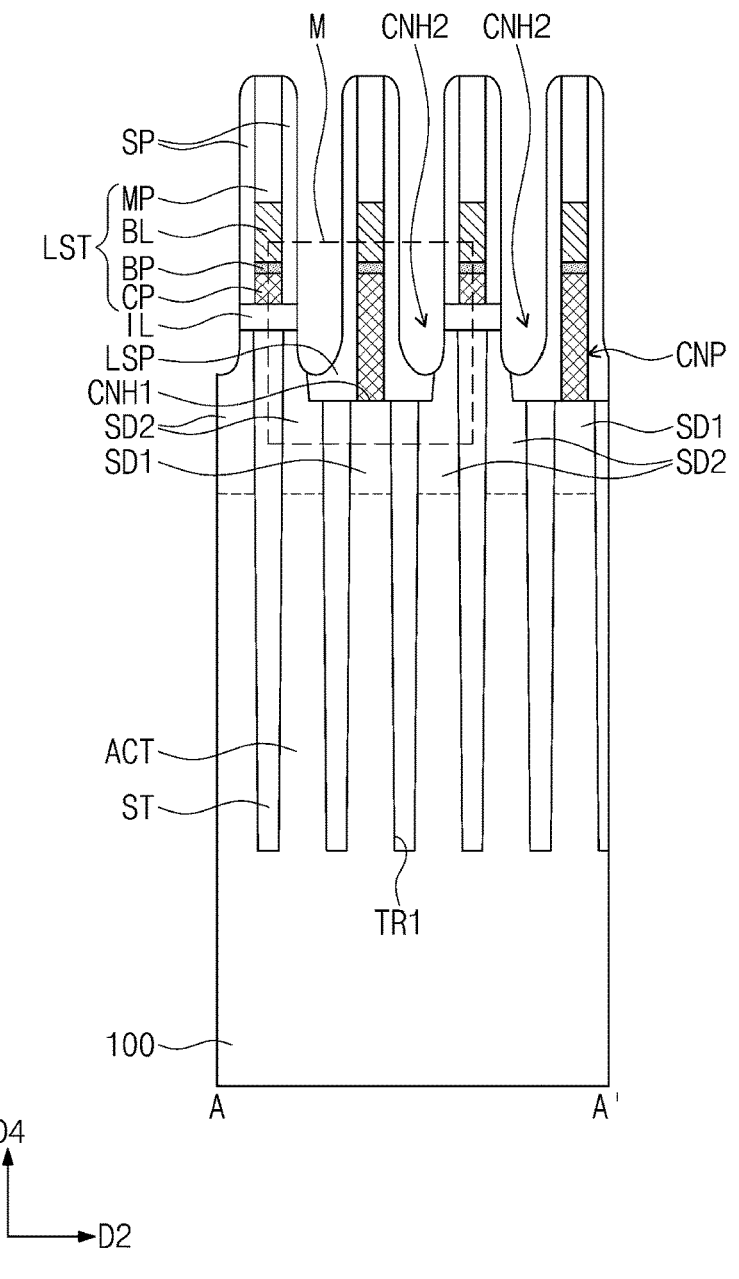
Figure 16B:
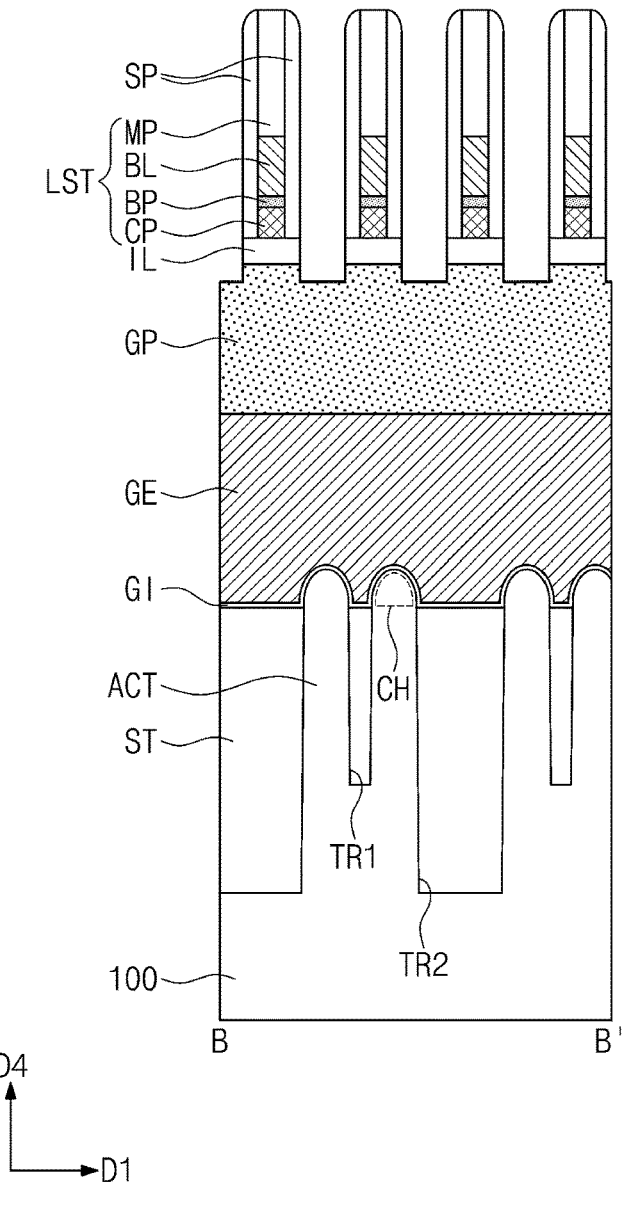
Figure 16C:
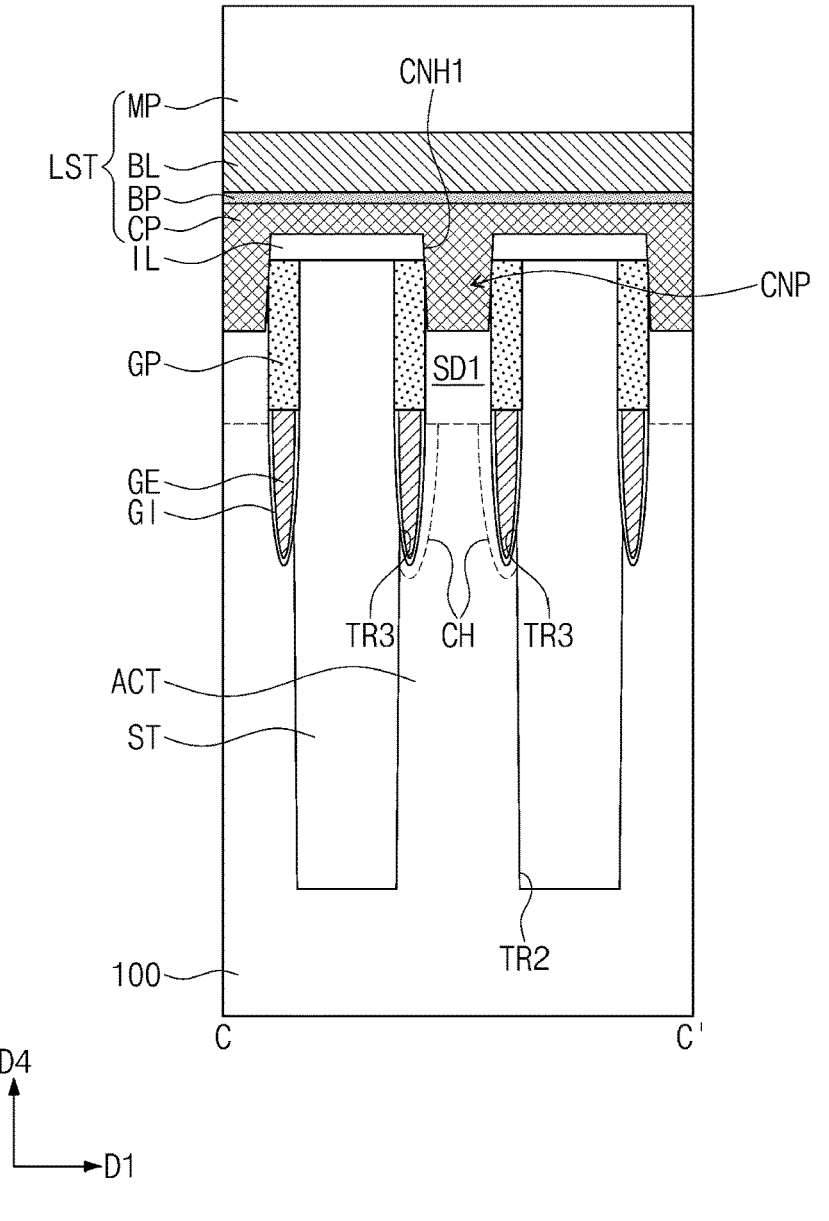
Figure 16D:
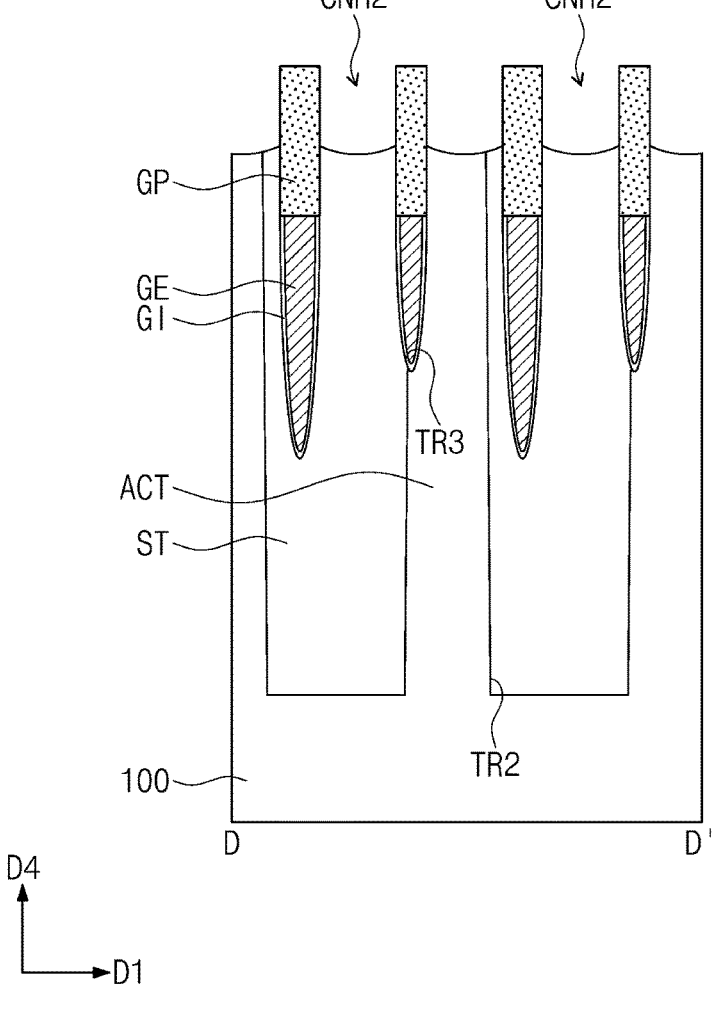
Figure 17:
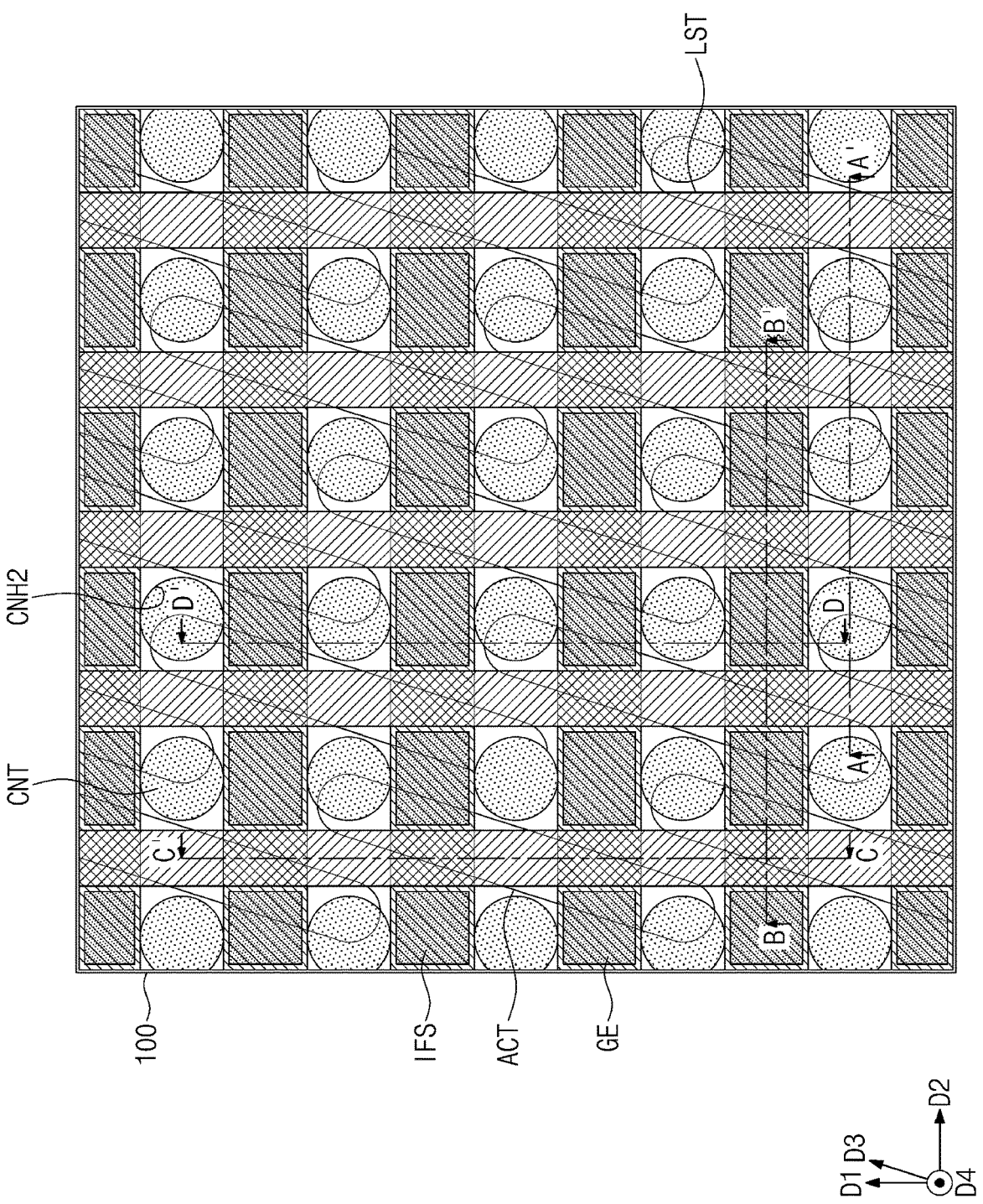
Figure 18A:
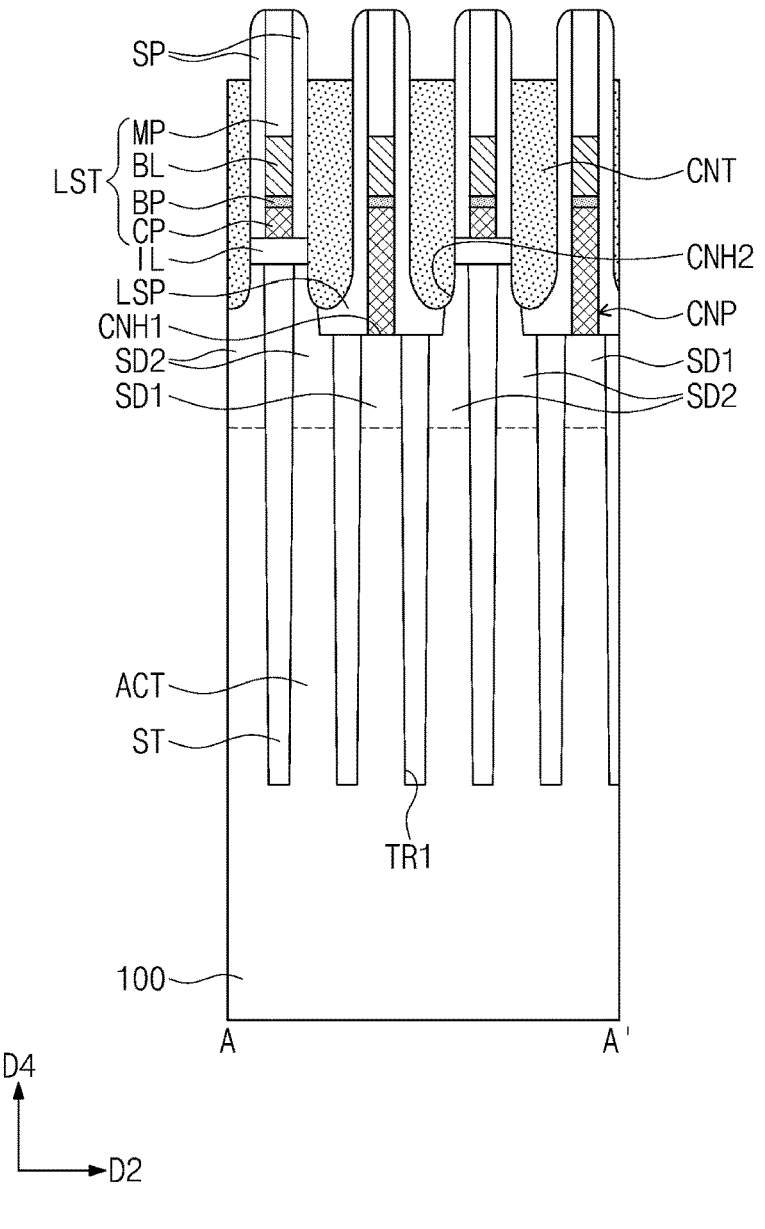
Figure 18B:
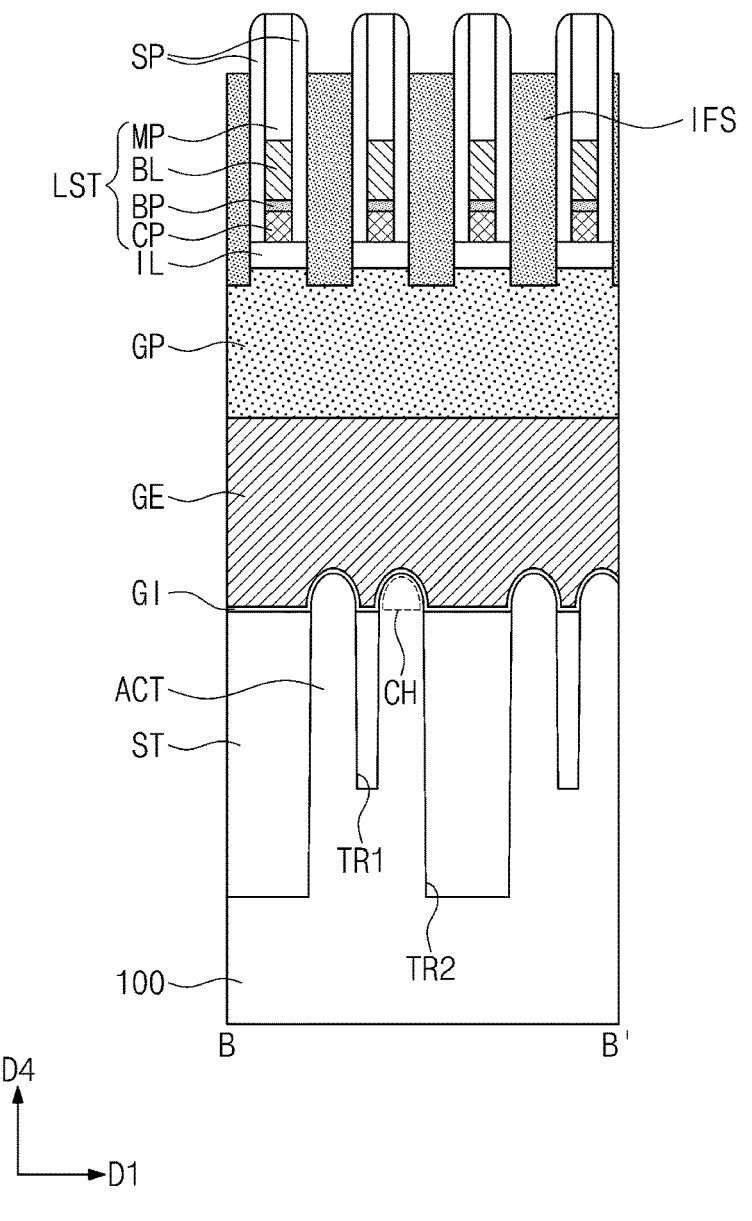
Figure 18C:
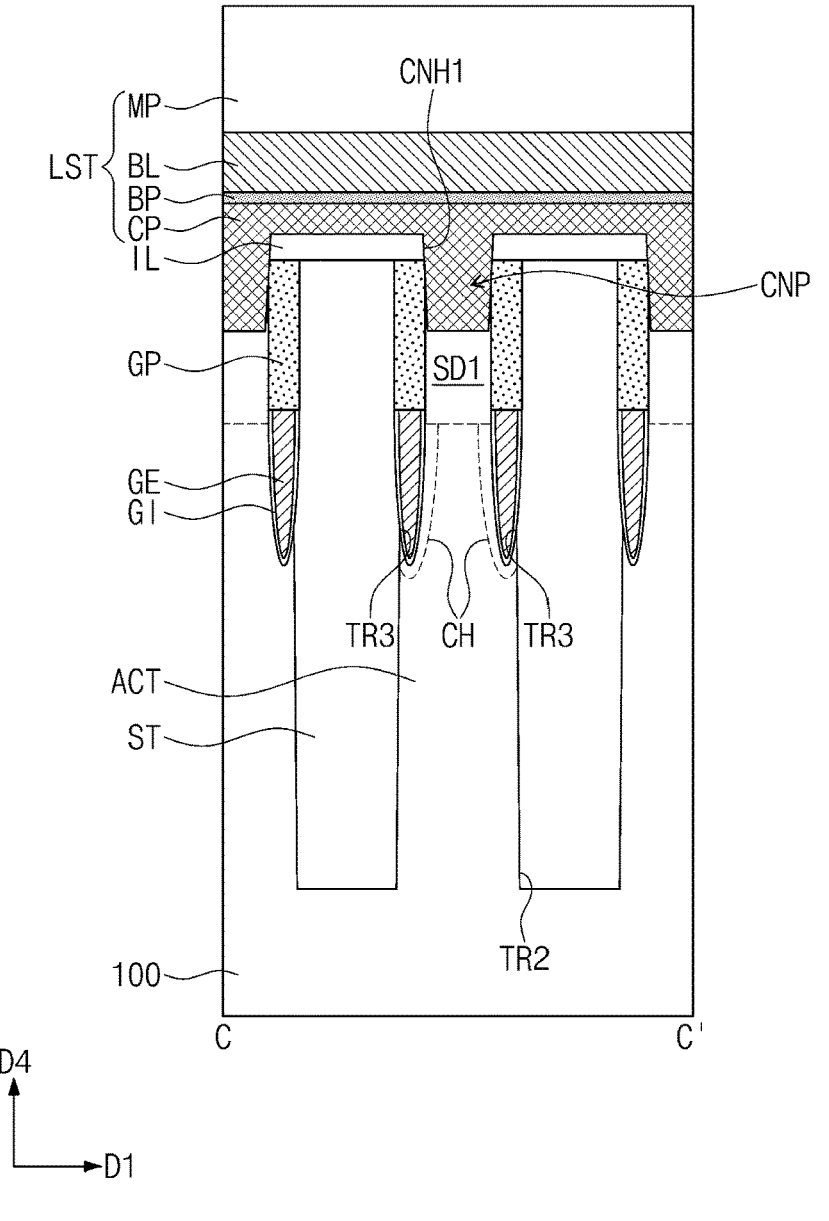
Figure 18D:
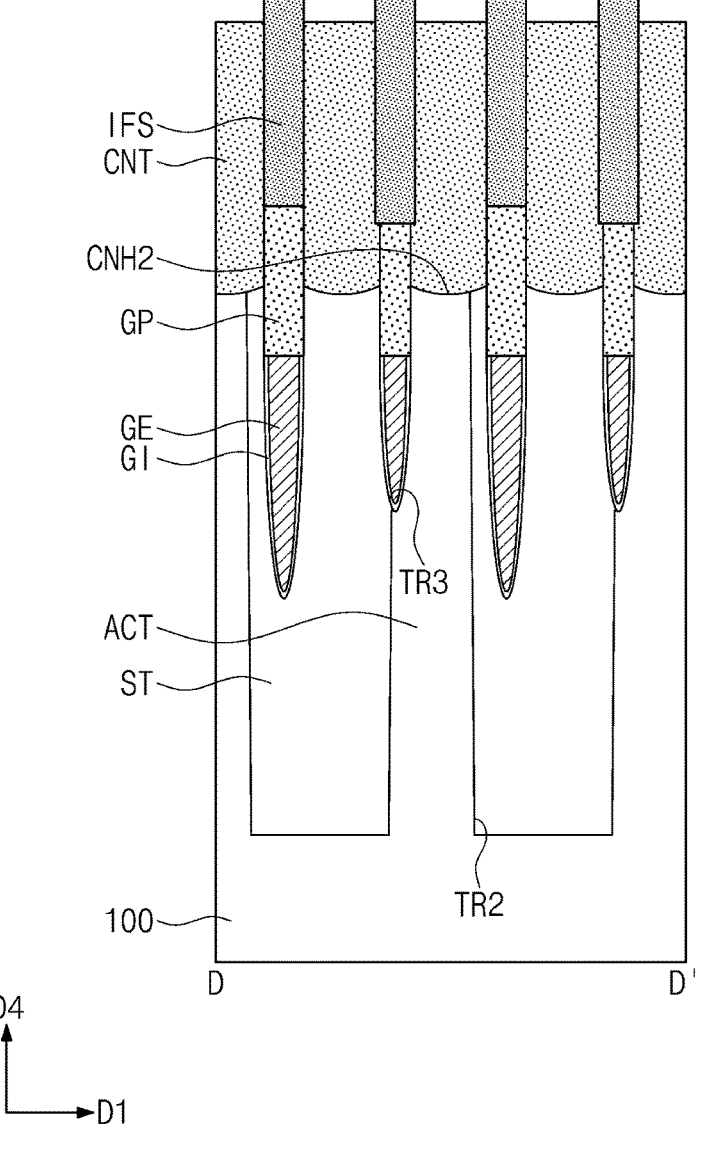

FIGS. 20 to 24 are cross-sectional views of section M depicted in FIG. 16A, illustrating operations of forming a lower spacer and a second contact hole according to some embodiments of present inventive concepts.

Figure 20:
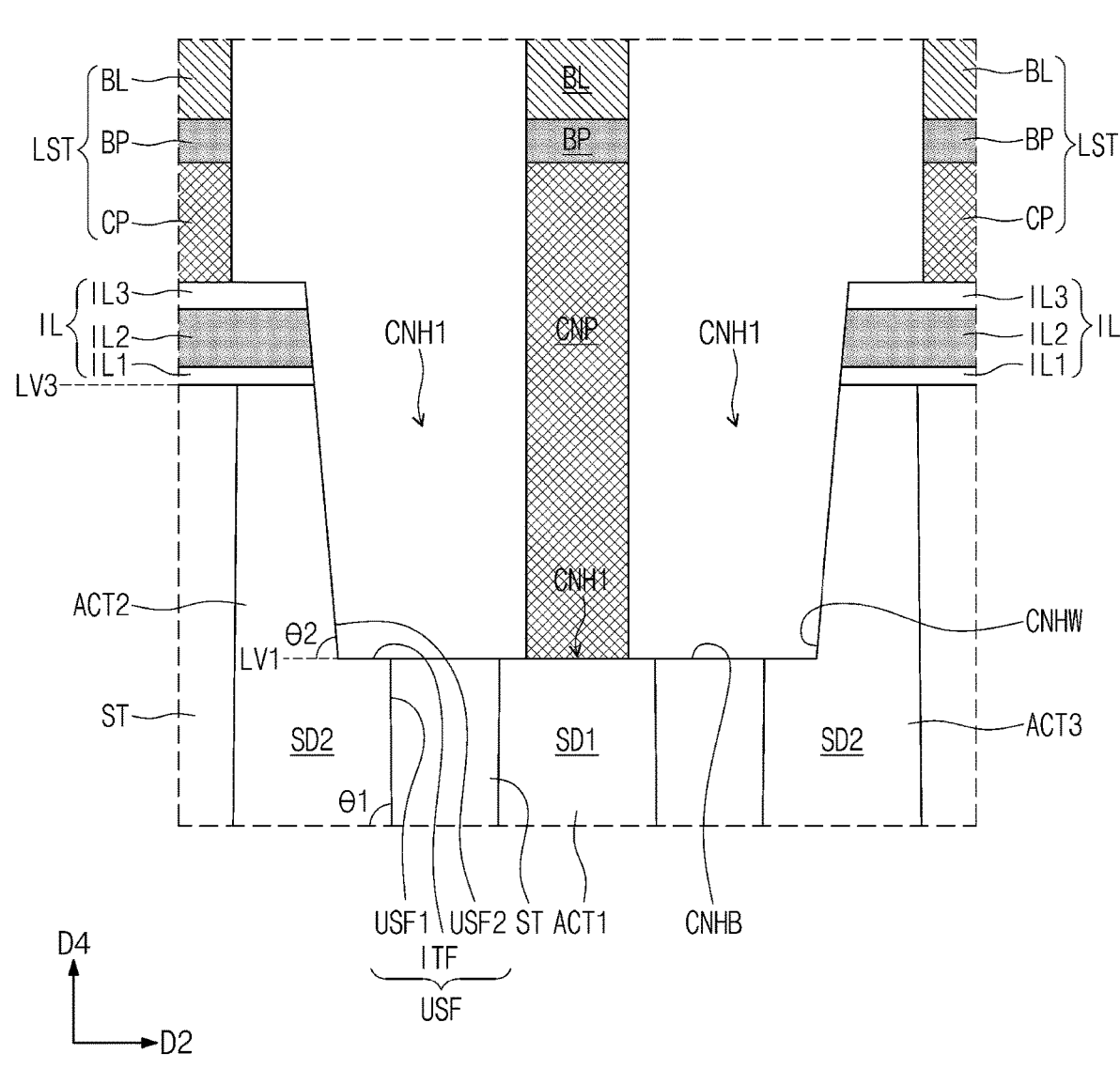
FIGS. 20 to 24 are cross-sectional views of section M depicted in FIG. 16A, illustrating operations of a method of forming a lower spacer and a second contact hole according to some embodiments of present inventive concepts.

Referring to FIG. 20, as discussed above, a patterning process may be employed to form the line structures LST. The formation of the line structures LST may include anisotropically etching the first conductive layer CL1 in the first contact hole CNH1 to form the contact part CNP. As the first contact hole CNH1 of FIG. 20 is formed to have a relatively large diameter in the second direction D2, the contact part CNP may be stably formed to contact only the first source/drain region SD1.

The upper lateral surface USF of the second source/drain region SD2 and a top surface of the device isolation layer ST may not be covered with the first conductive layer CL1 but may be completely exposed by the first contact hole CNH1.

Figure 21:
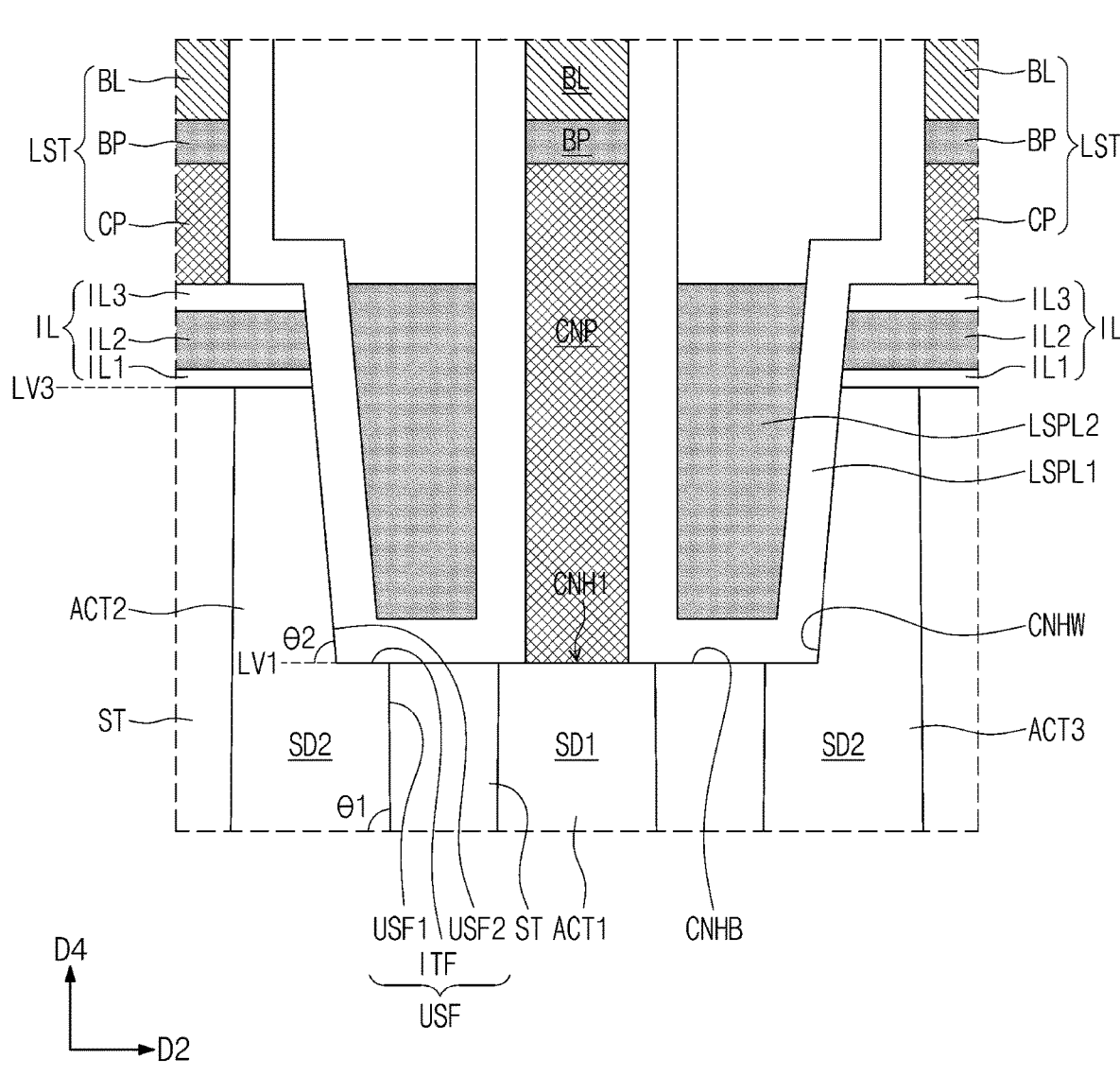

Referring to FIG. 21, a first lower spacer layer LSPL1 may be conformally formed in the first contact hole CNH1.

The first lower spacer layer LSPL1 may be formed to cover the sidewall of the line structure LST. For example, a silicon oxide layer may be deposited to form the first lower spacer layer LSPL1.

A second lower spacer layer LSPL2 may be formed on the first lower spacer layer LSPL1. For example, the second lower spacer layer LSPL2 may be formed on the first lower spacer layer LSPL1 so as to completely fill the first contact hole CNH1, and the second lower spacer layer LSPL2 may be recessed to allow the second lower spacer layer LSPL2 to have a top surface coplanar with that of the dielectric layer IL. A silicon nitride layer may be deposited to form the second lower spacer layer LSPL2.

Figure 22:
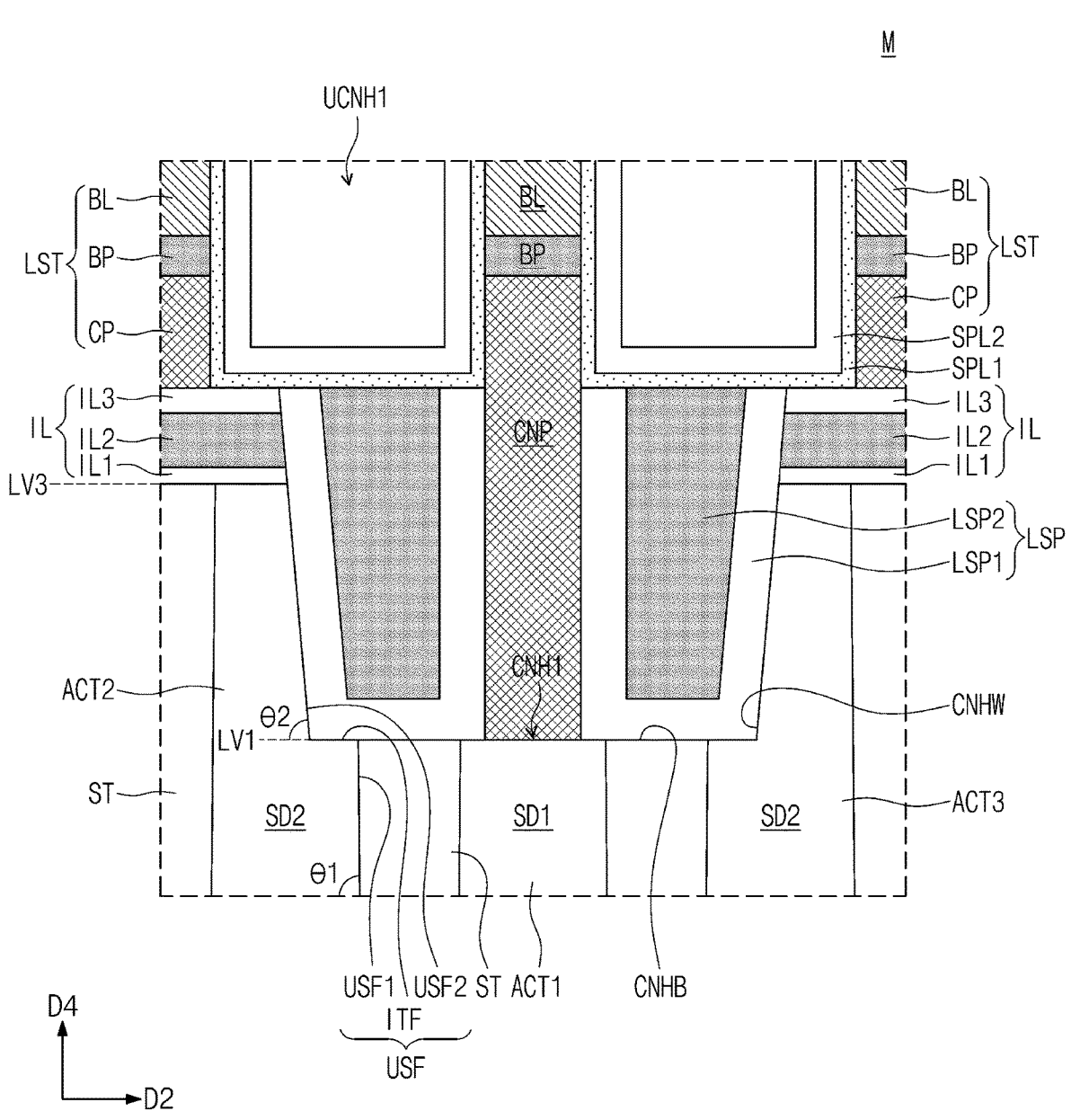

Referring to FIG. 22, the exposed first lower spacer layer LSPL1 may undergo a wet etching process to completely remove the first lower spacer layer LSPL1 that covers the sidewall of the line structure LST. The removal of the first lower spacer layer LSPL1 that covers the sidewall of the line structure LST may form a first upper contact hole UCNH1 between neighboring line structures LST.

The formation of the first upper contact hole UCNH1 may convert the first and second lower spacer layers LSPL1 and LSPL2 into first and second lower spacers LSP1 and LSP2. The first and second lower spacers LSP1 and LSP2 may provide a lower spacer LSP that fills the first contact hole CNH1. A top surface of the first lower spacer LSP1 may be coplanar with that of the second lower spacer LSP2.

A first spacer layer SPL1 and a second spacer layer SPL2 may be sequentially formed in the first upper contact hole UCNH1. For example, a silicon nitride layer may be deposited to form the first spacer layer SPL1. A silicon oxide layer may be deposited to form the second spacer layer SPL2.

Figure 23:
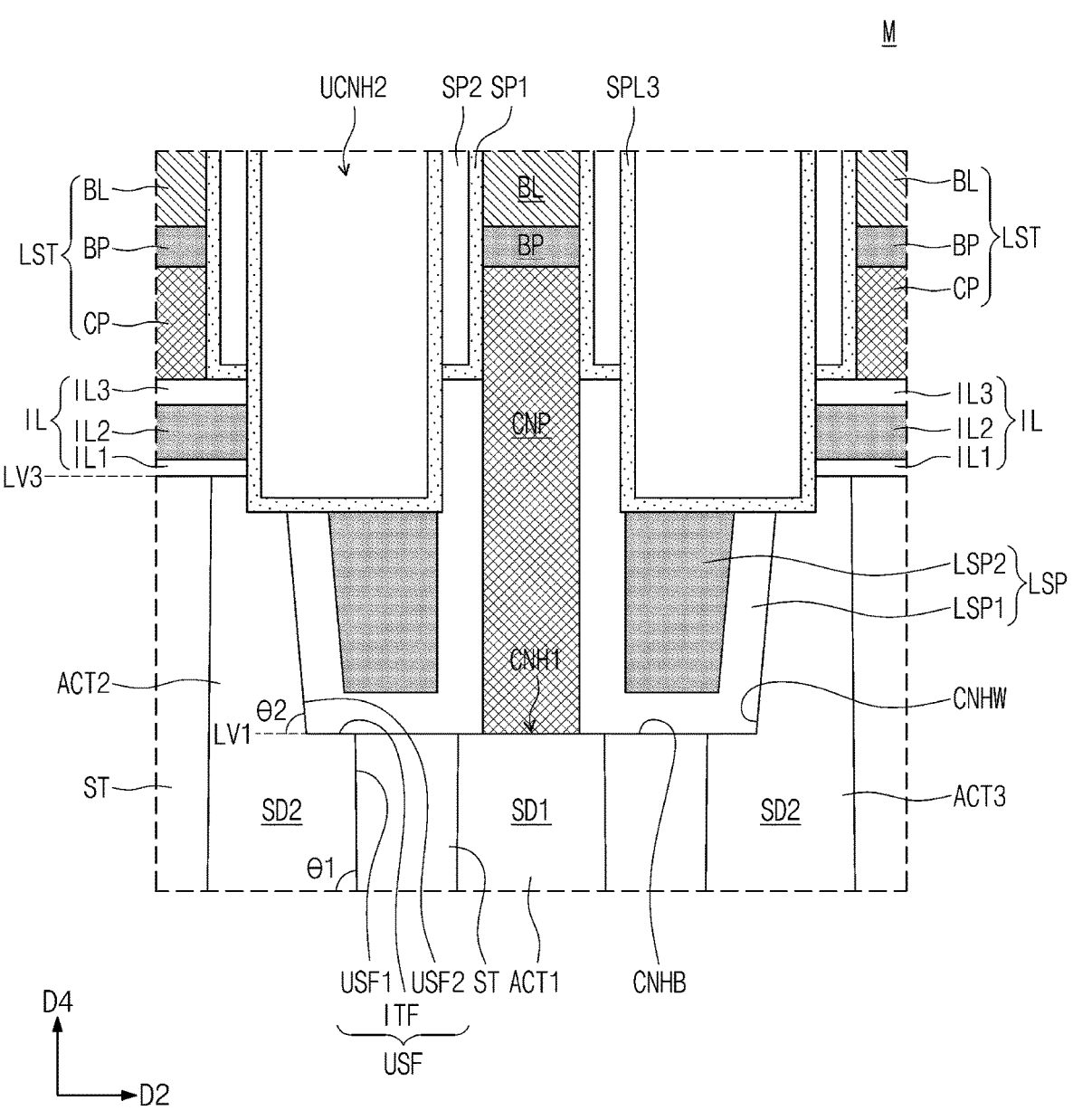

Referring to FIG. 23, a spacer etching process may be performed on the first and second spacer layers SPL1 and SPL2. The spacer etching process may be an anisotropic etching process. The first and second spacer layers SPL1 and SPL2 may be etched to respectively form first and second spacers SP1 and SP2 on the sidewall of the line structure LST.

The first and second spacer layers SPL1 and SPL2 may be etched to allow the first upper contact hole UCNH1 to form a second upper contact hole UCNH2. The second upper contact hole UCNH2 may have a bottom lower than that of the first upper contact hole UCNH1. The bottom of the second upper contact hole UCNH2 may be formed located at a level the same as or lower than the third level LV3 of the top surface of the substrate 100.

A third spacer layer SPL3 may be conformally formed in the second upper contact hole UCNH2. For example, a silicon nitride layer may be deposited to form the second spacer layer 305. A lower portion of the third spacer layer SPL3 may directly cover the first and second lower spacers LSP1 and LSP2. The lower portion of the third spacer layer SPL3 may directly cover sidewalls of the first, second, and third dielectric layers IL1, IL2, and IL3.

Figure 24:
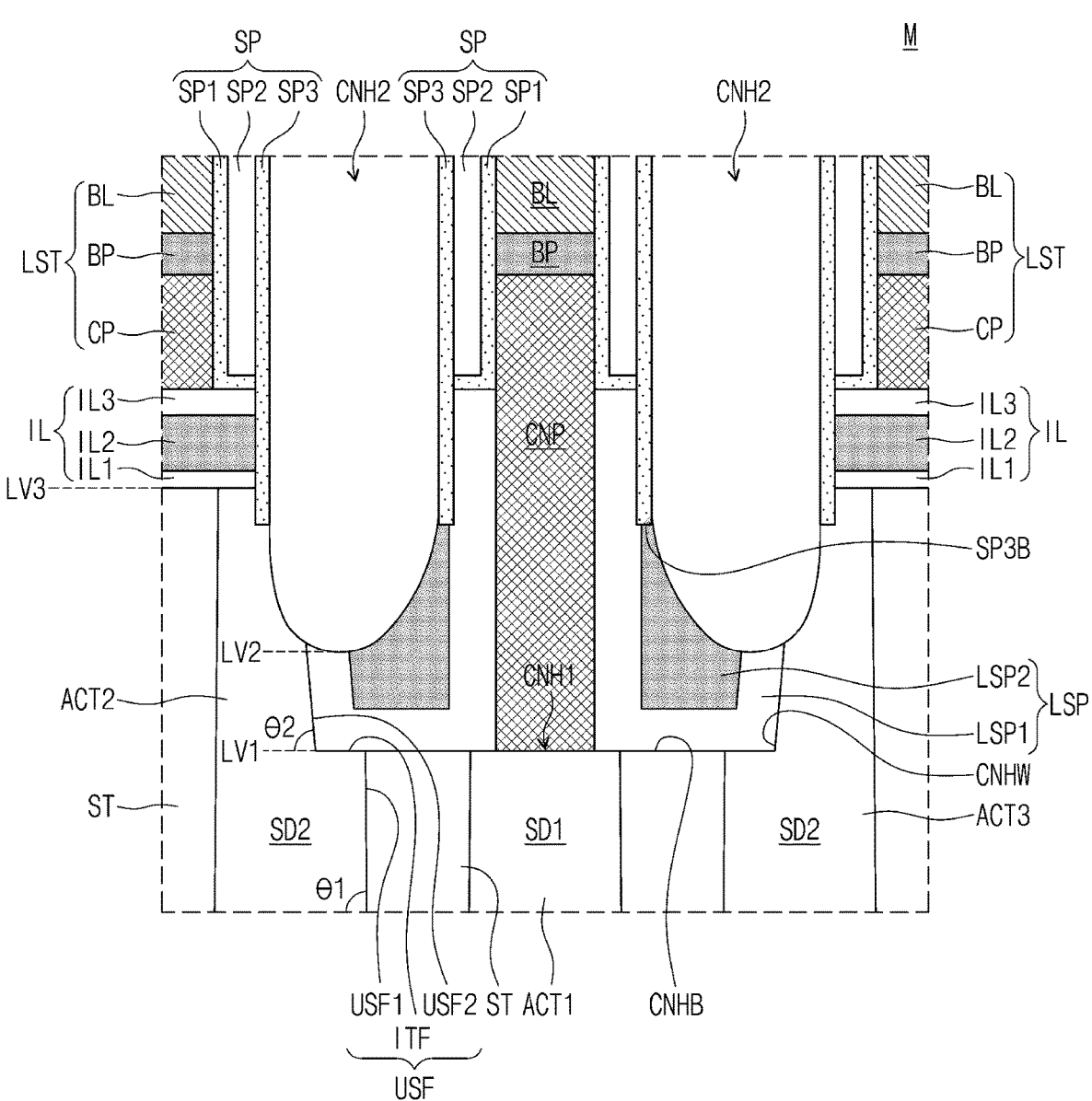

Referring to FIG. 24, the second upper contact hole UCNH2 may undergo an anisotropic etching process to form a second contact hole CNH2 that exposes the second source/drain region SD2. A lowermost point of the second contact hole CNH2 may be formed located at a second level LV2. The second level LV2 may be higher than the first level LV1 of the bottom CNHB of the first contact hole CNH1.

A lower portion of the second contact hole CNH2 may expose not only the second source/drain region SD2 but also the second lower spacer LSP2. The formation of the second contact hole CNH2 may include a wet etching process with respect to a silicon oxide layer. The first lower spacer LSP1 may be more heavily etched in the wet etching process (relative to the second lower spacer LSP2). Therefore, the lowermost point of the second contact hole CNH2 may be formed on the first lower spacer LSP1.

During the wet etching process, the second lower spacer LSP2 may reduce and/or prevent expansion of the lower portion of the second contact hole CNH2 toward the contact part CNP. It may therefore be possible to reduce and/or prevent process failures that may otherwise result from the second contact hole CNH2 exposing the contact part CNP, and as a result, semiconductor device reliability may be improved.

Figure 25:
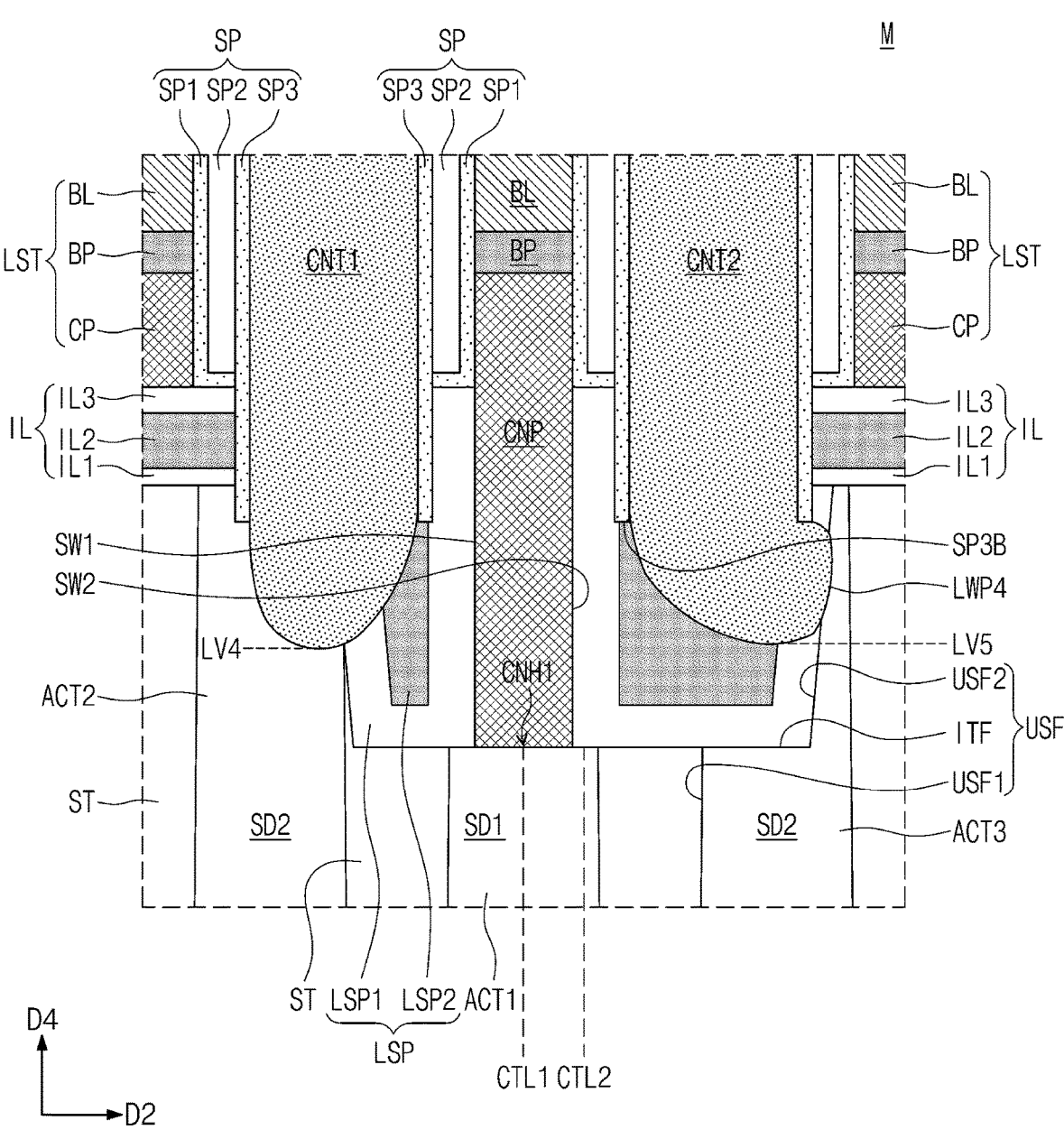
FIG. 25 is a cross-sectional view illustrating an example of a spacer depicted in FIG. 3.

FIG. 25 is a cross-sectional view illustrating an example of a spacer depicted in FIG. 3. In the disclosure that follows, a detailed description of technical features repetitive with respect to those discussed above with reference to FIGS. 1 to 3 will be omitted for purposes of clarity and/or conciseness, and differences thereof will be explained in detail.

Referring to FIG. 25, the first contact hole CNH1 may be formed horizontally misaligned with respect to the first source/drain region SD1. For example, the first contact hole CNH1 may be offset in the second direction D2 from the first source/drain region SD1. In this sense, a first central line CTL1 may be defined which passes through a center of the first source/drain region SD1, and a second central line CTL2 may be defined which passes through a center of the first contact hole CNH1. The second central line CTL2 may be offset in the second direction D2 from the first central line CTL1.

The contact part CNP may include a first sidewall SW1 and a second sidewall SW2 that are opposite to each other in the second direction D2. A pair of contacts CNT may include a first contact CNT1 adjacent to the first sidewall SW1 and a second contact CNT2 adjacent to the second sidewall SW2.

A volume (or size) of the lower spacer LSP that covers the first sidewall SW1 may be less than that of the lower spacer LSP that covers the second sidewall SW2. For example, a volume (or size) of the second lower spacer LSP2 between the first contact CNT1 and the first sidewall SW1 may be less than that of the second lower spacer LSP2 between the second contact CNT2 and the second sidewall SW2.

The stepwise upper lateral surface USF may be omitted from the second active pattern ACT2 connected to the first contact CNT1. This may be because the first contact hole CNH1 is offset and an upper portion of the second active pattern ACT2 is not recessed due to the first contact hole CNH1.

The stepwise upper lateral surface USF may be included in the third active pattern ACT3 connected to the second contact CNT2. A description of the upper lateral surface USF may be substantially the same as that discussed above with reference to FIG. 3. The flat surface ITF of FIG. 25 may be larger than the flat surface ITF of FIG. 3.

A lower portion of the second contact CNT2 may include an extension part LWP4. The extension part LWP4 may penetrate the first lower spacer LSP1 to come into contact with the second source/drain region SD2 of the third active pattern ACT3. The second contact CNT2 may be coupled through the extension part LWP4 to the second source/drain region SD2.

As discussed above with reference to FIG. 24, a process used to form the second contact hole CNH2 may include a wet etching process that etches preferentially with respect to a silicon oxide layer of first lower spacer LSP1. Even when the first contact hole CNH1 is misaligned, the wet etching process may remove the first lower spacer LSP1 and expose the second source/drain region SD2. An area where the first lower spacer LSP1 is removed may be filled with a conductive material to form the extension part LWP4 of FIG. 25.

The misalignment of the first contact hole CNH1 may cause the first contact CNT1 and the second contact CNT2 to have different shapes. A lowermost point of the first contact CNT1 may be located at a fourth level LV4, and a lowermost point of the second contact CNT2 may be located at a fifth level LV5 different from the fourth level LV4. For example, the fifth level LV5 may be higher than the fourth level LV4.

A lower portion of the first contact CNT1 may include first to third lower parts LWP1 to LWP3 discussed above with reference to FIG. 3. The lower portion of the second contact CNT2 may include the extension part LWP4 that horizontally extends toward the second source/drain region SD2. The lower portion of the first contact CNT1 may not include the extension part LWP4.

As discussed above, the first contact hole CNH1 according to some embodiments of present inventive concepts and the lower spacer LSP formed in the first contact hole CNH1 may reduce and/or prevent short-circuit failure between the contact part CNP and the contact CNT. In addition, even when the first contact hole CNH1 is misaligned with respect to the first source/drain region SD1, the contact CNT may be stably coupled through the lower spacer LSP to the second source/drain region SD2. Accordingly, a semiconductor device may have improved reliability and/or increased yield.

According to some embodiments of present inventive concepts, short-circuit failure of a semiconductor memory device between a contact part of a bit line and a contact of a data storage element may be reduced and/or prevented, and/or device reliability may be increased. A high integration of memory devices may increase difficulty in forming the contact part, but some embodiments of present inventive concepts may increase and/or secure an etching margin for the etching process and reduce and/or prevent process failures.

According to some embodiments of present inventive concepts, the contact of the data storage element may be stably coupled to an active pattern even when a contact hole is misaligned. As a result, process yields may be increased in semiconductor memory device fabrication processes.

Although some embodiments of present inventive concepts have been illustrated in the accompanying drawings, it will be understood by those skilled in the art that various changes and/or modifications may be made without departing from the technical spirit and features of the present inventive concepts. It will be apparent to those skilled in the art that various substitutions, modifications, and/or changes may be made thereto without departing from the scope and spirit of present inventive concepts disclosed herein.

What is claimed is:

1. A semiconductor memory device, comprising:
   a substrate including a first active pattern and a second active pattern that are adjacent to each other, wherein a trench separates the first and second active patterns, wherein the first active pattern includes a first source/drain region, wherein the second active pattern includes a second source/drain region, wherein the second source/drain region includes first and second sidewall surfaces adjacent the first source/drain region and a connecting surface that connects the first and second sidewall surfaces, and wherein the second sidewall surface is set back from the first sidewall surface relative to the first source/drain region;

a device isolation layer in the trench between the first and second active patterns, wherein the device isolation layer is on the first sidewall surface of the second source/drain region;

a bit line that extends in a first direction on the substrate, the bit line including a contact part electrically connected to the first source/drain region;

a lower spacer on the device isolation layer, on a sidewall of the contact part of the bit line, and on the second sidewall surface of the second source/drain region;

a contact coupled to the second source/drain region, wherein a portion of the lower spacer is between the contact and the contact part of the bit line;

a landing pad on the contact; and a data storage element on the landing pad, wherein a portion of the lower spacer is disposed on the connecting surface.

2. The semiconductor memory device of claim 1, wherein the lower spacer includes a first lower spacer and a second lower spacer on the first lower spacer, wherein the contact includes, a first lower part in contact with the second source/drain region, a second lower part in contact with the first lower spacer, and a third lower part in contact with the second lower spacer, wherein the second lower part is between the first and third lower parts.

3. The semiconductor memory device of claim 2, wherein the first lower spacer includes a silicon oxide layer, and the second lower spacer includes a silicon nitride layer.

4. The semiconductor memory device of claim 2, wherein a lowermost point of the contact is at the second lower part of the contact.

5. The semiconductor memory device of claim 2, further comprising:

a plurality of upper spacers on the lower spacer, wherein the plurality of upper spacers cover a sidewall of the bit line, wherein a bottom of an outermost one of the plurality of upper spacers is in contact with a top surface of the second lower spacer.

6. The semiconductor memory device of claim 1, further comprising a gate electrode that extends across the first and second active patterns, wherein the bit line extends in the first direction, wherein the gate electrode extends in a second direction that intersects the first direction, and wherein the first and second source/drain regions are adjacent to each other in the second direction.

7. The semiconductor memory device of claim 1, wherein the connecting surface comprises a flat surface at a first level, and wherein a lowermost point of the contact is at a second level higher than the first level.

8. The semiconductor memory device of claim 1, wherein the first sidewall surface has an inclination of a first angle, the second sidewall surface has an inclination of a second angle, and the first angle is greater than the second angle.

9. The semiconductor memory device of claim 1, wherein a portion of the first source/drain region in contact with the contact part of the bit line defines a first planar surface, wherein the connecting surface of the second source/drain region defines a second planar surface, and wherein the first and second planar surfaces are coplanar.

10. The semiconductor memory device of claim 1, wherein a lower portion of the contact includes an extension part penetrating laterally through the lower spacer and being electrically connected to the second source/drain region.

11. A semiconductor memory device, comprising:

a substrate that includes a first active pattern, a second active pattern, and a third active pattern, the first active pattern being between the second and third active patterns;

a bit line on the substrate, the bit line including a contact part electrically connected to the first active pattern;

a first lower spacer on a first sidewall of the contact part, wherein the first lower spacer is between the contact part and the second active pattern;

a second lower spacer on a second sidewall of the contact part, wherein the second lower spacer is between the contact part and the third active pattern;

a first contact adjacent to the first lower spacer and coupled to the second active pattern;

a second contact adjacent to the second lower spacer and coupled to the third active pattern;

a first landing pad on the first contact;

a second landing pad on the second contact;

a first data storage element on the first landing pad; and a second data storage element on the second landing pad, wherein a volume of the first lower spacer on the first sidewall is different from a volume of the second lower spacer on the second sidewall, wherein a lowermost point of the first contact is at a first level, and wherein a lowermost point of the second contact is at a second level different from the first level.

12. The semiconductor memory device of claim 11, wherein a lower portion of the second contact includes an extension part penetrating laterally through the second lower spacer to the third active pattern and being electrically connected to the third active pattern.

13. The semiconductor memory device of claim 12, wherein a lower portion of the first contact includes no extension part.

14. The semiconductor memory device of claim 11, further comprising a device isolation layer in a first trench between the first and second active patterns and in a second trench between the first and third active patterns, wherein the third active pattern includes a first upper sidewall surface with the device isolation layer thereon, a second upper sidewall surface with the second lower spacer thereon, and a connecting surface that connects the first upper sidewall surface and the second upper sidewall surface, and wherein the second upper sidewall surface is set back from the first upper sidewall surface relative to the contact part of the bit line, and wherein the second contact is connected to the second upper sidewall surface.

15. The semiconductor memory device of claim 14, wherein portions of a sidewall surface of the second active pattern are substantially planar from below the first contact to below the first lower spacer.

16. A semiconductor memory semiconductor memory device, comprising:

a substrate including a first active pattern and a second active pattern that are adjacent to each other, wherein the substrate includes a trench between the first and second active patterns, the first active pattern including a first source/drain region, and the second active pattern including a second source/drain region;

a device isolation layer in the trench between the first and second active patterns;

a dielectric layer on the substrate;

a line structure on the dielectric layer, the line structure including a contact part that penetrates the dielectric layer and is coupled to the first source/drain region, a bit line on the contact part, and a barrier pattern between the bit line and the contact part;

a lower spacer on a sidewall of the contact part;

an upper spacer on the lower spacer, the upper spacer covering a sidewall of the bit line;

a contact coupled to the second source/drain region, wherein the lower spacer is between the contact and the contact part;

a landing pad on the contact; and a data storage element on the landing pad, wherein the lower spacer includes a first lower spacer and a second lower spacer on the first lower spacer, and the first and second lower spacers comprise different materials, and wherein the second source/drain region includes a first upper sidewall surface with the device isolation layer thereon, a second upper sidewall surface with the first lower spacer thereon, and a connecting surface that connects the first upper sidewall surface and the second upper sidewall surface to each other, and wherein the second upper sidewall surface is set back from the first upper sidewall surface relative to the contact part of the line structure.

17. The semiconductor memory device of claim 16, wherein the first lower spacer is on the connecting surface and on the second upper sidewall surface.

18. The semiconductor memory device of claim 16, wherein a lower portion of the contact includes a first part in contact with the second source/drain region, a second part in contact with the first lower spacer, and a third part in contact with the second lower spacer, and wherein the second part is between the first and third parts.

19. The semiconductor memory device of claim 16, wherein the first upper sidewall surface and the second upper sidewall surface have different inclinations relative to each other.

20. The semiconductor memory device of claim 16, wherein the second lower spacer is between the contact and a portion of the first lower spacer.

* * * * *